US012726733B2

(12) United States Patent
Suess et al.

(10) Patent No.: US 12,726,733 B2
(45) Date of Patent: Sep. 1, 2026

(54) PIXELS WITH MULTIPLE OPERATING MODES, AND ASSOCIATED SYSTEMS, DEVICES, AND METHODS

(71) Applicant: OMNIVISION TECHNOLOGIES, INC., Santa Clara, CA (US)

(72) Inventors: Andreas Suess, San Jose, CA (US); Sangjoo Lee, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 57 days.

(21) Appl. No.: 18/919,325

(22) Filed: Oct. 17, 2024

(65) Prior Publication Data

US 2025/0193550 A1 Jun. 12, 2025

Related U.S. Application Data

(60) Provisional application No. 63/608,150, filed on Dec. 8, 2023.

(51) Int. Cl.
*H04N 25/77* (2023.01)
*H04N 23/667* (2023.01)
(Continued)

(52) U.S. Cl.
CPC ........... *H04N 25/77* (2023.01); *H04N 23/667* (2023.01); *H04N 25/11* (2023.01); *H04N 25/134* (2023.01);
(Continued)

(58) Field of Classification Search
CPC ...... H04N 25/77; H04N 23/667; H04N 25/11; H04N 25/134; H04N 25/135; H04N 25/42;
(Continued)

(56) References Cited

U.S. PATENT DOCUMENTS

| | | | |
|---|---|---|---|
| 8,780,240 | B2 | 7/2014 | Posch et al. |
| 9,544,513 | B2 | 1/2017 | Shin et al. |

(Continued)

FOREIGN PATENT DOCUMENTS

| | | | |
|---|---|---|---|
| WO | 2021159231 | A1 | 8/2021 |
| WO | 2023106232 | A1 | 6/2023 |

(Continued)

OTHER PUBLICATIONS

European Search Report received in EP App No. 24212229.9 dated Jan. 29, 2025, pp. all.

(Continued)

*Primary Examiner* — Gevell V Selby
(74) *Attorney, Agent, or Firm* — Dorsey & Whitney LLP

(57) ABSTRACT

Pixels with multiple operating modes (and associated systems, devices, and methods) are disclosed herein. In one embodiment, a pixel arrangement includes a pixel including a first photosensor, a second photosensor, a floating diffusion, a first event vision sensor (EVS) connection coupling the pixel to first EVS readout circuitry and configured to receive first charge from the first photosensor, and a second EVS connection coupling the pixel to second EVS readout circuitry and configured to receive second charge from the second photosensor. The pixel further includes a first transfer transistor selectively coupling the first photosensor to the floating diffusion, a second transfer transistor selectively coupling the first photosensor to the first EVS connection, and a third transfer transistor selectively coupling the second photosensor to the floating diffusion. In some embodiments, the pixel further includes a fourth transfer transistor selectively coupling the second photosensor to the second EVS connection.

34 Claims, 11 Drawing Sheets

(51) Int. Cl.

| | |
|---|---|
| ***H04N 25/11*** | (2023.01) |
| ***H04N 25/13*** | (2023.01) |
| ***H04N 25/42*** | (2023.01) |
| ***H04N 25/47*** | (2023.01) |
| ***H04N 25/621*** | (2023.01) |
| ***H04N 25/78*** | (2023.01) |
| ***H04N 25/79*** | (2023.01) |
| ***H10F 39/00*** | (2025.01) |
| ***H10F 39/18*** | (2025.01) |

(52) U.S. Cl.
CPC ........... *H04N 25/135* (2023.01); *H04N 25/42* (2023.01); *H04N 25/47* (2023.01); *H04N 25/621* (2023.01); *H04N 25/78* (2023.01); *H10F 39/182* (2025.01); *H10F 39/8023* (2025.01); *H10F 39/8053* (2025.01); *H10F 39/8063* (2025.01); *H04N 25/79* (2023.01)

(58) Field of Classification Search
CPC ...... H04N 25/47; H04N 25/621; H04N 25/78; H04N 25/79; H04N 25/704; H04N 25/778; H04N 25/46; H10F 39/182; H10F 39/8023; H10F 39/8053; H10F 39/8063
See application file for complete search history.

(56) References Cited

U.S. PATENT DOCUMENTS

| | | | | |
|---|---|---|---|---|
| 9,961,291 | B2 | 5/2018 | Chen | |
| 11,218,659 | B2 | 1/2022 | Xu et al. | |
| 11,240,449 | B2 | 2/2022 | Mostafalu et al. | |
| 11,240,454 | B2 | 2/2022 | Gao et al. | |
| 11,272,133 | B1 | 3/2022 | Zhang et al. | |
| 11,280,918 | B2 | 3/2022 | Nishihara et al. | |
| 11,706,543 | B2 | 7/2023 | Xu et al. | |
| 12,101,563 | B2 | 9/2024 | Wang et al. | |
| 12,442,901 | B2 | 10/2025 | Suess et al. | |
| 2003/0127672 | A1 | 7/2003 | Rahn et al. | |
| 2010/0141812 | A1 | 6/2010 | Hirota | |
| 2010/0214460 | A1 | 8/2010 | Hasegawa et al. | |
| 2010/0295981 | A1 | 11/2010 | Morimoto | |
| 2013/0088625 | A1 | 4/2013 | Iwata et al. | |
| 2013/0181117 | A1 | 7/2013 | Shimizu et al. | |
| 2015/0002635 | A1 | 1/2015 | Kawai et al. | |
| 2015/0077609 | A1 | 3/2015 | Okamoto et al. | |
| 2015/0201118 | A1 | 7/2015 | Lee et al. | |
| 2015/0256777 | A1 | 9/2015 | Ishii et al. | |
| 2016/0353034 | A1 | 12/2016 | Mauritzson et al. | |
| 2017/0125464 | A1 | 5/2017 | Abe et al. | |
| 2017/0127002 | A1 | 5/2017 | Eshel et al. | |
| 2018/0190699 | A1 | 7/2018 | Lee et al. | |
| 2020/0007808 | A1 | 1/2020 | Jung et al. | |
| 2020/0084403 | A1 | 3/2020 | Suh et al. | |
| 2020/0244913 | A1 | 7/2020 | Jung et al. | |
| 2020/0358971 | A1 | 11/2020 | Shim et al. | |
| 2021/0067100 | A1 | 3/2021 | Choi et al. | |
| 2021/0074745 | A1 | 3/2021 | Mi et al. | |
| 2021/0084246 | A1 | 3/2021 | Mostafalu et al. | |
| 2021/0099656 | A1 | 4/2021 | Cho et al. | |
| 2021/0168314 | A1* | 6/2021 | Mehta | H04N 25/47 |
| 2021/0176417 | A1 | 6/2021 | Xu et al. | |
| 2021/0185264 | A1 | 6/2021 | Wong et al. | |
| 2021/0320140 | A1 | 10/2021 | Kitano et al. | |
| 2021/0377473 | A1 | 12/2021 | Sano et al. | |
| 2021/0399689 | A1 | 12/2021 | Choi et al. | |
| 2021/0400223 | A1* | 12/2021 | Kitano | H04N 25/46 |
| 2022/0021835 | A1 | 1/2022 | Suh et al. | |
| 2022/0038645 | A1 | 2/2022 | Takahashi | |
| 2022/0078365 | A1 | 3/2022 | Xu et al. | |
| 2022/0102403 | A1 | 3/2022 | Ma et al. | |
| 2022/0141403 | A1 | 5/2022 | Mandelli et al. | |
| 2022/0201236 | A1 | 6/2022 | Gao et al. | |
| 2022/0360730 | A1 | 11/2022 | Fujita et al. | |
| 2023/0007207 | A1 | 1/2023 | Xiao et al. | |
| 2023/0008577 | A1 | 1/2023 | Niwa | |
| 2023/0020850 | A1 | 1/2023 | Jun et al. | |
| 2023/0217119 | A1 | 7/2023 | Lee et al. | |
| 2023/0239595 | A1 | 7/2023 | Inada et al. | |
| 2023/0282667 | A1 | 9/2023 | Kim | |
| 2023/0283928 | A1 | 9/2023 | Gao et al. | |
| 2023/0308056 | A1 | 9/2023 | Choi et al. | |
| 2023/0336882 | A1 | 10/2023 | Sohn | |
| 2023/0362518 | A1* | 11/2023 | Shiina | H04N 25/76 |
| 2024/0015414 | A1 | 1/2024 | Mabuchi et al. | |
| 2024/0031697 | A1 | 1/2024 | Mostafalu et al. | |
| 2024/0073557 | A1 | 2/2024 | Suess et al. | |
| 2024/0214708 | A1 | 6/2024 | Finateu et al. | |
| 2024/0267644 | A1* | 8/2024 | Mandelli | H04N 25/46 |
| 2024/0340552 | A1 | 10/2024 | Niwa et al. | |
| 2024/0380364 | A1 | 11/2024 | Choi et al. | |
| 2025/0008236 | A1 | 1/2025 | Oyama et al. | |
| 2025/0016465 | A1 | 1/2025 | Hunt et al. | |
| 2025/0052901 | A1 | 2/2025 | Harada et al. | |
| 2025/0089384 | A1 | 3/2025 | Nakamura | |
| 2025/0159374 | A1 | 5/2025 | Sato et al. | |
| 2025/0193516 | A1 | 6/2025 | Lee et al. | |
| 2025/0193538 | A1 | 6/2025 | Suess et al. | |
| 2025/0193541 | A1 | 6/2025 | Suess et al. | |
| 2025/0193555 | A1 | 6/2025 | Suess et al. | |
| 2025/0194271 | A1 | 6/2025 | Suess et al. | |
| 2025/0209572 | A1 | 6/2025 | Zhao et al. | |
| 2025/0358548 | A1 | 11/2025 | Honda | |
| 2025/0359386 | A1 | 11/2025 | Ma | |
| 2026/0122363 | A1 | 4/2026 | Suess et al. | |

FOREIGN PATENT DOCUMENTS

| | | | |
|---|---|---|---|
| WO | 2023186544 | A1 | 10/2023 |
| WO | 2024018812 | A1 | 1/2024 |
| WO | 2024127912 | A1 | 6/2024 |
| WO | 2024160446 | A1 | 8/2024 |

OTHER PUBLICATIONS

U.S. Appl. No. 19/330,257, entitled: "Hybrid CIS/EVS Image Sensor Supporting PDAF in Multiple Operating Modes," filed Sep. 16, 2025, pp. all.

U.S. Appl. No. 19/330,397, entitled: "Image Sensors Supporting Different Gain Levels for Different Pixels," filed Sep. 16, 2025, pp. all.

U.S. Appl. No. 19/352,777, entitled: "Reconfigurable Hybrid Event-Based Vision Sensor and CMOS Image Sensor" filed Oct. 8, 2025, pp. all.

Brandli, et al., "A 240×180 130 dB 3 μs Latency Global Shutter Spatiotemporal Vision Sensor", IEEE Journal of Solid-State Circuits, vol. 49, No. 10, Oct. 2014, pp. 2333-2341.

Chen, Shoushun, "Development of Event-based Sensor and Applications", Omnivision Sensor Solutions. Jun. 2021, pp. 1-17.

Guo, et al., "A 3-Wafer-Stacked Hybrid 15MPixel CIS + 1MPixel EVS with 4.6GEvent/s Readout, In-Pixel TDC and On-Chip ISP and ESP Function", ISSCC 2023, Session 5, Image Sensors 5.1, Feb. 20, 2023, p. 1-3.

Kodama, et al., "1.22μm 35.6Mpixel RGB Hybrid Event-Based Vision Sensor with 4.88μm-Pitch Event Pixels and up to 10K Event Frame Rate by Adaptive Control on Event Sparsity", ISSCC, Feb. 20, 2023, Session 5, Image Sensors, 5.2. pp. 1-3.

Li, et al., "Design of an RGBW color VGA rolling and global shutter dynamic and active-pixel vision sensor", 2015 IEEE International Symposium on Circuits and Systems (ISCAS), Lisbon, Portugal, 2015, pp. 718-721, doi: 10.1109/ISCAS.2015.7168734.

Niwa, et al., "A 2.97μm-Pitch Event-Based Vision Sensor with Shared Pixel Front-End Circuitry and Low-Noise Intensity Readout Mode", ISSCC 2023, Session 5 Image Sensors, 5.3, Feb. 20, 2023, pp. 1-3.

Posch, et al., "An asynchronous time-based image sensor", 2008 IEEE International Symposium on Circuits and Systems (ISCAS), Seattle, WA, USA, 2008, pp. 2130-2133, doi: 10.1109/ISCAS.2008.4541871.

(56) References Cited

OTHER PUBLICATIONS

U.S. Appl. No. 18/982,869, entitled: "Hybrid CIS/EVS Image Sensor Providing High EVS Resolution," filed Dec. 16, 2024, pp. all.
Non-Final Office Action received in U.S. Appl. No. 18/918,813 dated Jan. 20, 2026, pp. all.
Non-Final Office Action received in U.S. Appl. No. 18/918,591 dated Jan. 23, 2026, pp. all.
Non-Final Office Action received in U.S. Appl. No. 18/919,339 dated Feb. 19, 2026, pp. all.
Notice of Allowance received in U.S. Appl. No. 18/919,214 dated Feb. 5, 2026, pp. all.
Extended European Search Report received in EP App No. 25209192.1 dated Mar. 31, 2025, pp. all.
Extended European Search Report received in EP App No. 25209189.7 dated Mar. 31, 2026, pp. all.
United States Notice of Allowance received in U.S. Appl. No. 18/919,214 dated Apr. 14, 2026, pp. all.
U.S. Appl. No. 19/649,057, filed Apr. 15, 2026, pp. all.

* cited by examiner

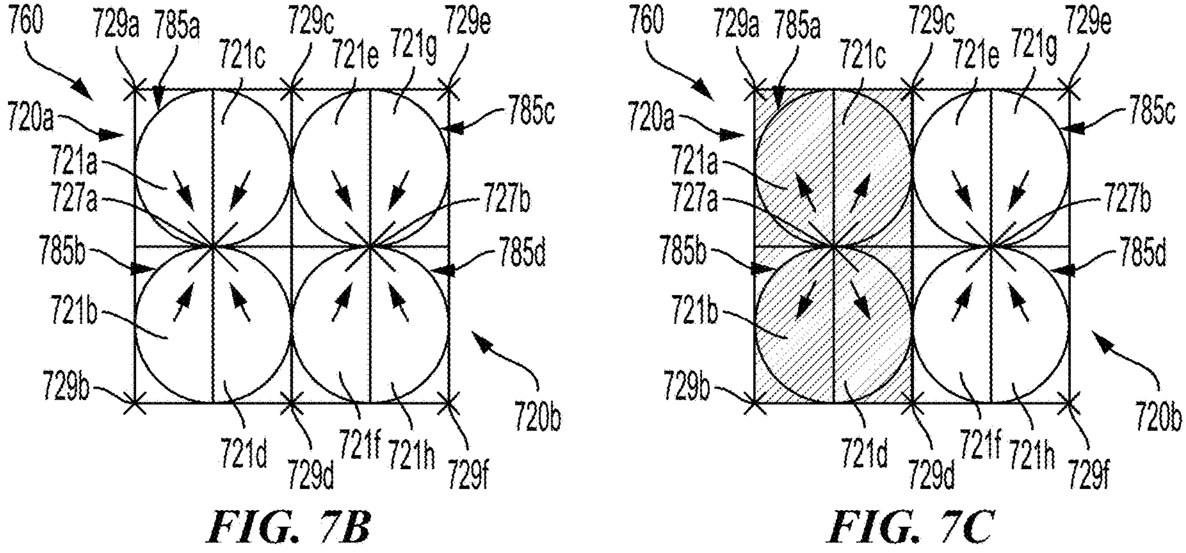
*FIG. 7B*
*FIG. 7C*
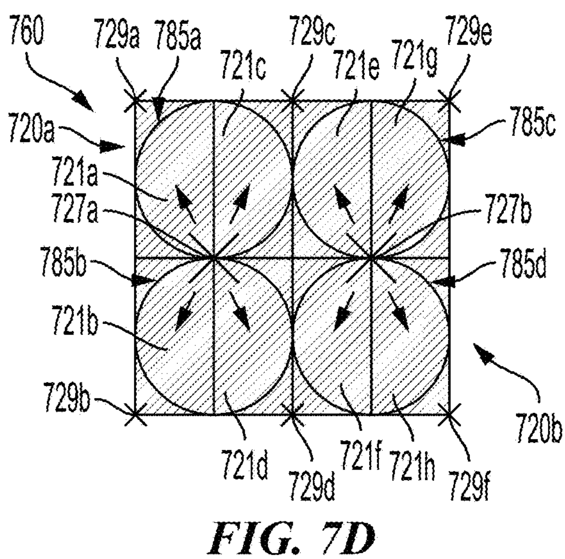
*FIG. 7D*

PIXELS WITH MULTIPLE OPERATING MODES, AND ASSOCIATED SYSTEMS, DEVICES, AND METHODS

CROSS-REFERENCE TO RELATED APPLICATION(S)

The present application claims the benefit of U.S. Provisional Patent Application No. 63/608,150, filed Dec. 8, 2023, which is incorporated by reference herein in its entirety.

TECHNICAL FIELD

This disclosure relates generally to image sensors. For example, several embodiments of the present technology relate to pixels with multiple operating modes, such as a complementary metal oxide semiconductor (CMOS) image sensor (CIS) operating mode, an event-based vision sensor (EVS), and a hybrid CIS and EVS operating mode, and to associated systems, devices, and methods.

BACKGROUND

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present technology are described below with reference to the following figures, in which like or similar reference numbers are used to refer to like or similar components throughout unless otherwise specified.

FIGS. 7B-7D are partial schematic diagrams of the pixel arrangement of FIG. 7A.

Figure 1:
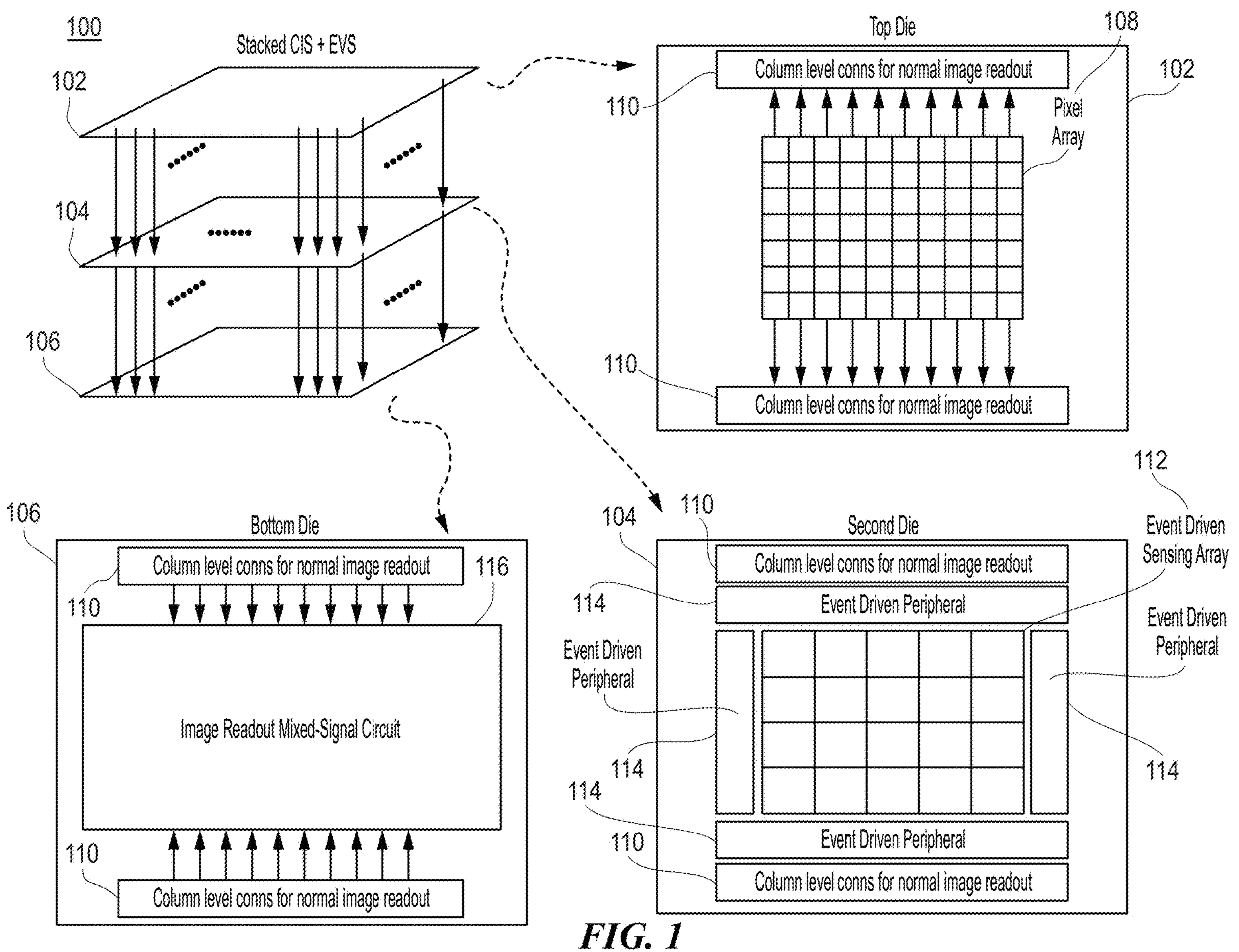
FIG. 1 is a partially schematic diagram of a stacked hybrid complementary metal oxide semiconductor (CMOS) image sensor (CIS) and event-based vision sensor (EVS) system, configured in accordance with various embodiments of the present technology.

Skilled artisans will appreciate that elements in the figures are illustrated for simplicity and clarity and are not necessarily drawn to scale. For example, the dimensions of some of the elements in the figures may be exaggerated relative to other elements to aid in understanding of various aspects of the present technology. In addition, common but well-understood elements or methods that are useful or necessary in a commercially feasible embodiment are often not depicted in the figures, or described in detail below, to avoid unnecessarily obscuring the description of various aspects of the present technology.

DETAILED DESCRIPTION

The present disclosure relates to pixels with multiple operating modes, and to associated systems, devices, and methods. For example, several embodiments of the present technology are directed to pixels (and associated pixel arrangements and/or image sensors) that can be operated in a CIS operating mode, an EVS operating mode, or a hybrid (CIS and EVS) operating mode. As a specific example, a pixel can include a floating diffusion, a plurality of photosensors, and a first plurality of transfer gates (or transfer transistors) selectively coupling a corresponding one of the plurality of photosensors to the floating diffusion. The pixel can further include (i) a plurality of event vision sensor (EVS) connections that each couple the pixel to EVS readout circuitry and (ii) a second plurality of transfer gates (or transfer transistors) selectively coupling a respective one of the plurality of photosensors to a respective one of the plurality of EVS connections. The first plurality of transfer gates and the second plurality of transfer gates can collectively form a mode switch that facilitates switching the pixel between the various operating modes. In the following description, specific details are set forth to provide a thorough understanding of aspects of the present technology. One skilled in the relevant art will recognize, however, that the systems, devices, and techniques described herein can be practiced without one or more of the specific details set forth herein, or with other methods, components, materials, etc.

Reference throughout this specification to an "example" or an "embodiment" means that a particular feature, structure, or characteristic described in connection with the example or embodiment is included in at least one example or embodiment of the present technology. Thus, use of the phrases "for example," "as an example," or "an embodiment" herein are not necessarily all referring to the same example or embodiment and are not necessarily limited to the specific example or embodiment discussed. Furthermore, features, structures, or characteristics of the present technology described herein may be combined in any suitable manner to provide further examples or embodiments of the present technology.

It will be understood that, although the terms first, second, third, etc. may be used in the disclosure and claims to describe various elements, these elements should not be limited by these terms and should not be used to determine the process sequence or formation order of associated elements. Unless indicated otherwise, these terms are merely used to distinguish one element from another element. Thus, a first element discussed below could be termed a second element without departing from the teachings of the disclosed embodiments.

Spatially relative terms (e.g., "beneath," "below," "over," "under," "above," "upper," "top," "bottom," "left," "right," "center," "middle," and the like) may be used herein for ease of description to describe one element's or feature's relationship relative to one or more other elements or features as illustrated in the figures. It will be understood that the spatially relative terms are intended to encompass different orientations of a device or system in use or operation, in addition to the orientation depicted in the figures. For example, if a device or system illustrated in the figures is rotated, turned, or flipped about a horizontal axis, elements or features described as "below" or "beneath" or "under" one or more other elements or features may then be oriented "above" the one or more other elements or features. Thus, the exemplary terms "below" and "under" are non-limiting and can encompass both an orientation of above and below. The device or system may additionally, or alternatively, be otherwise oriented (e.g., rotated ninety degrees about a vertical axis, or at other orientations) than illustrated in the figures, and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

A. OVERVIEW

Pixels, pixel arrangements, and image sensors with multiple operating modes are disclosed. For example, several embodiments of the preset technology are directed to various imaging systems with pixel circuits that provide hybrid functionality (e.g., simultaneous image/video capturing and event driven sensing capabilities). Although normal image/video sensors offer great image and/or video capturing capabilities, one of the limitations with normal image/video sensors is that normal image sensors do not provide ultra-high frame rates and ultra-high speed capture capabilities that may be useful in a variety of applications such as machine vision, gaming, and artificial intelligence sensing areas. Attempts to provide typical image/video sensors with such ultra-high frame rates and ultra-high speed capabilities have resulted in compromised solutions that provide poor quality image captures compared to their normal image sensor counterparts.

It is appreciated that circuit designs in accordance with the teachings of the present disclosure address at least some of the issues discussed above. For example, a pixel disclosed herein can operate in a hybrid mode in which the pixel simultaneously provides great image and video capture capabilities using a first set of photosensors of the pixel, and (e.g., simultaneously) senses events at ultra-high frame rates and at ultra-high speeds using a second set of photosensors of the pixel for a wide variety of event driven (or other) applications. Continuing with this example, the pixel may also operate in (i) a CIS-only mode in which the first set of photosensors and the second set of photosensors are used to provide image and video capture capabilities and/or (ii) an EVS-only mode in which the first set of photosensors and the second set of photosensors are used to sense events at ultra-high frame rates and at ultra-high speeds. The pixel can include a mode switch that is controllable to transition the pixel between the hybrid mode, the CIS-only mode, and/or the EVS-only mode. The mode switch can be formed by a plurality of transfer gates (or transfer transistors) included within the pixel. Some of the transfer gates can be arranged to selectively couple corresponding photosensors of the pixel to a floating diffusion of the pixel (e.g., to output CIS information, such as intensity information, corresponding to light incident on the corresponding photosensors), and others of the transfer gates can be arranged to selectively couple respective photosensors of the pixel to EVS readout circuitry via corresponding EVS connections (e.g., to output non-CIS information, such as contrast change information or change in intensity, corresponding to light incident on the respective photosensors). Pixel arrangements and/or image sensors incorporating such pixels can similarly be operated in a hybrid mode, a CIS-only mode, and/or an EVS-only mode, such as by controlling respective mode switches of the pixels.

Thus, as will be shown and described in various examples below, an example pixel arrangement includes a first photosensor configured to photogenerate first charge (e.g., one or more electrons or holes) based at least in part on first light incident on the first photosensor; a second photosensor different from the first photosensor and configured to photogenerate second charge (e.g., one or more electrons or holes) based at least in part on second light incident on the second photosensor; and a floating diffusion configured to receive the first charge from the first photosensor and the second charge from the second photosensor. The pixel can further include a first event vision sensor (EVS) connection usable to couple the pixel to first EVS readout circuitry and configured to receive the first charge from the first photosensor, and a second EVS connection usable to couple the pixel to second EVS readout circuitry and configured to receive the second charge from the second photosensor. The pixel can further include a mode switch including a first switch selectively coupling the first photosensor to the floating diffusion, a second switch selectively coupling the first photosensor to the first EVS connection, a third switch selectively coupling the second photosensor to the floating diffusion, and/or a fourth switch selectively coupling the second photosensor to the second EVS connection. The mode switch can be controllable to transition the pixel between (i) a first mode (e.g., a CIS-only mode or a hybrid CIS and EVS mode) in which the pixel is usable to generate a first output corresponding to intensity information of the first light, the second light, or both the first light and the second light; and (ii) a second mode (e.g., an EVS-only mode or a hybrid CIS and EVS mode) in which the pixel is usable to generate a second output corresponding to contrast information of the first light, the second light, or both the first light and the second light.

As will also be shown and described in various examples below, an example pixel arrangement may be disposed in a semiconductor material. The pixel arrangement can include a pixel having a floating diffusion disposed in the semiconductor material at a central region of the semiconductor material surrounded by a plurality of photosensors, the plurality of photosensors disposed in the semiconductor material at locations distributed about the floating diffusion, and a plurality of first transfer gates (or first transfer transistors). Each first transfer gate of the plurality of first transfer gates can be disposed in the semiconductor material at a location between the floating diffusion and a respective photosensor of the plurality of photosensors, and can be configured to selectively couple the respective photosensor to the floating diffusion. The pixel can further include a plurality of event vision sensor (EVS) connections disposed at least partially in the semiconductor material and usable to couple a respective one of the plurality of photosensors to EVS readout circuitry, and a plurality of second transfer gates (or second transfer transistors). Each second transfer gate of the plurality of second transfer gates can be disposed in the semiconductor material at a location between a corresponding one of the plurality of photosensors and a corresponding one of the plurality of EVS connections, and can be configured to selectively couple the corresponding one of the plurality of photosensors to the corresponding one of the plurality of EVS connections.

In some embodiments, the pixel arrangement described above can further include a second pixel neighboring the first pixel. The second pixel can have a second floating diffusion disposed in the semiconductor material at a second central region of the semiconductor material, a second plurality of photosensors disposed in the semiconductor material at locations distributed about the second floating diffusion, and a second plurality of first transfer gates (or first transfer transistors). Each first transfer gate of the second plurality of first transfer gates can be disposed in the semiconductor material at a location between the second floating diffusion and a respective photosensor of the second plurality of photosensors, and can be configured to selectively couple the respective photosensor to the second floating diffusion. The second pixel can further include a second plurality of EVS connections disposed at least partially in the semiconductor material and usable to couple a respective one of the second plurality of photosensors to the EVS readout circuitry, and a second plurality of second transfer gates (or second transfer transistors). Each second transfer gate of the second plurality of second transfer gates can be disposed in the semiconductor material at a location between a corresponding one of the second plurality of photosensors and a corresponding one of the second plurality of EVS connections, and can be configured to selectively couple the corresponding one of the second plurality of photosensors to the corresponding one of the second plurality of EVS connections. In some embodiments, the first plurality of EVS connections of the pixel and the second plurality of EVS connections of the second pixel can include at least one EVS connection in common such that the at least one EVS connection is shared between the pixel and the second pixel.

B. SELECTED EMBODIMENTS OF HYBRID IMAGING SENSORS WITH MULTIPLE OPERATING MODES, AND ASSOCIATED SYSTEMS, DEVICES, AND METHODS

FIG. 1 is a partially schematic diagram of a stacked complementary metal oxide semiconductor (CMOS) image sensor (CIS) with an event-based vision sensor (EVS) system 100 ("the stacked system 100"), configured in accordance with various embodiments of the present technology. As shown, the stacked system 100 includes a first die 102, a second die 104, and a third die 106 that are stacked and coupled together in a stacked chip scheme. In some embodiments, the first die 102, the second die 104, and the third die 106 are semiconductor dies that include a suitable semiconductor material (e.g., silicon). In the illustrated embodiment, the first die 102 (also referred to herein as the "top die") includes a pixel array 108. The third die 106 (also referred to herein as the "bottom die") includes an image readout circuit 116 (also referred to herein as "image readout mixed-signal circuitry"). The image readout circuit 116 can be coupled to the pixel array 108 of the top die 102 through column level connections for normal image readout 110 (e.g., for intensity or luminance signal readout). In some embodiments, the column level connections for normal image readout 110 are implemented from column bitlines of the pixel array 108 with through silicon vias (TSVs) that extend between the top die 102 and the bottom die 106, and that are routed through the second die 104.

In some embodiments, the pixel array 108 is a two-dimensional (2D) array including a plurality of pixel cells (also referred to as "pixels" or as "pixel circuits") that each includes at least one photosensor (e.g., at least one photodiode) exposed to incident light. As shown in the illustrated embodiment, the pixels are arranged into rows and columns. As discussed further herein, pixels of the pixel array 108 can be operated at least partially as CIS pixels and/or at least partially as EVS pixels. When operated at least partially as CIS pixels, photosensors of the pixels can be used to acquire image data of a person, place, object, etc., which can then be used to render images and/or video of a person, place, object, etc. For example, each pixel, when at least partially operated in a CIS mode, can include one or more photosensors configured to photogenerate image charge in response to the incident light. After each pixel that is at least partially operated in a CIS mode has acquired its image charge, the corresponding analog image charge data can be read out by the image readout circuit 116 in the bottom die 106 through the column bit lines. In some embodiments, the image charge from each row of the pixel array 108 may be read out in parallel through column bit lines by the image readout circuit 116.

The image readout circuit 116 in the bottom die 106 can include amplifiers, analog to digital converter (ADC) circuitry, associated analog support circuitry, associated digital support circuitry, etc., for normal image readout and processing. In some embodiments, the image readout circuit 116 may also include event driven readout circuitry, which will be described in greater detail below. In operation, the photogenerated analog image charge signals are read out from the pixel cells of pixel array 108, amplified, and converted to digital values in the image readout circuit 116. In some embodiments, image readout circuit 116 may read out a row of image data at a time. In other examples, the image readout circuit 116 may read out the image data using a variety of other techniques (not illustrated), such as a serial readout or a full parallel readout of all pixels simultaneously.

The image data may be stored or even manipulated by applying post image effects (e.g., crop, rotate, remove red eye, adjust brightness, adjust contrast, and the like).

In the illustrated embodiment, the second die 104 (also referred to herein as the "middle die") includes an event driven sensing array 112 that is coupled to the pixel array 108 in the top die 102. In some embodiments, the event driven sensing array 112 is coupled to the pixels of the pixel array 108 through hybrid bonds between the top die 102 and the middle die 104. The event driven sensing array 112 can include an array of event driven circuits. In some embodiments, each one of the event driven circuits in the event driven sensing array 112 is coupled to at least one of the plurality of pixels of the pixel array 108 through hybrid bonds between the top die 102 and the middle die 104 to asynchronously detect events that occur in light that is incident upon the pixel array 108 in accordance with the teachings of the present disclosure.

As discussed above, pixels of the pixel array 108 can be operated at least partially as EVS pixels. When operated at least partially as EVS pixels, photosensors of the pixels can be used to track changes in the intensity of light incident on the photosensors from an external scene. In particular, the photosensors can photogenerate image charge (electrons or holes) or photocurrent in response to the incident light from the external scene. The photogenerated image can then be provided, via an EVS connection such as a hybrid bond, to a coupled event driven circuit of the event driven sensing array 112. In some embodiments, the event driven circuit includes (i) a photocurrent-to-voltage converter coupled to the photosensor to convert photocurrent generated by the photosensor to a voltage; and (ii) a filter amplifier coupled to the photocurrent-to-voltage converter to generate a filtered and amplified signal in response to the voltage received from the photocurrent-to-voltage converter. The event driven circuit can further include a threshold comparison circuit to determine and generate event detection signals in response to events asynchronously detected in incident light received from the external scene. For example, the threshold comparison circuit may generate an event detection signal when a detected change in the pixel signal at the output of the filter amplifier relative to a reference pixel signal is greater than a predetermined voltage threshold value. It is appreciated that the described event driven readout circuit is one example implementation to read out event signals. Various implementations for readout circuitry and readout schemes for event vision sensor pixels are well known. Thus, details on circuitry and readout techniques for event driven circuits are largely omitted here for the sake of brevity and to avoid obscuring aspects of the present technology.

As discussed above, event detection signals are generated by the event driven circuits in the event driven sensing array 112. The event detection signals can be received and processed by event driven peripheral circuitry 114 that, in some embodiments, is arranged around the periphery of the event driven sensing array 112 in the middle die 104, as is shown in FIG. 1. The embodiment illustrated in FIG. 1 also illustrates column level connections for normal image readout 110 that are routed through the middle die 104 between the top die 102 and the bottom die 106.

Figures 2A, 2B:
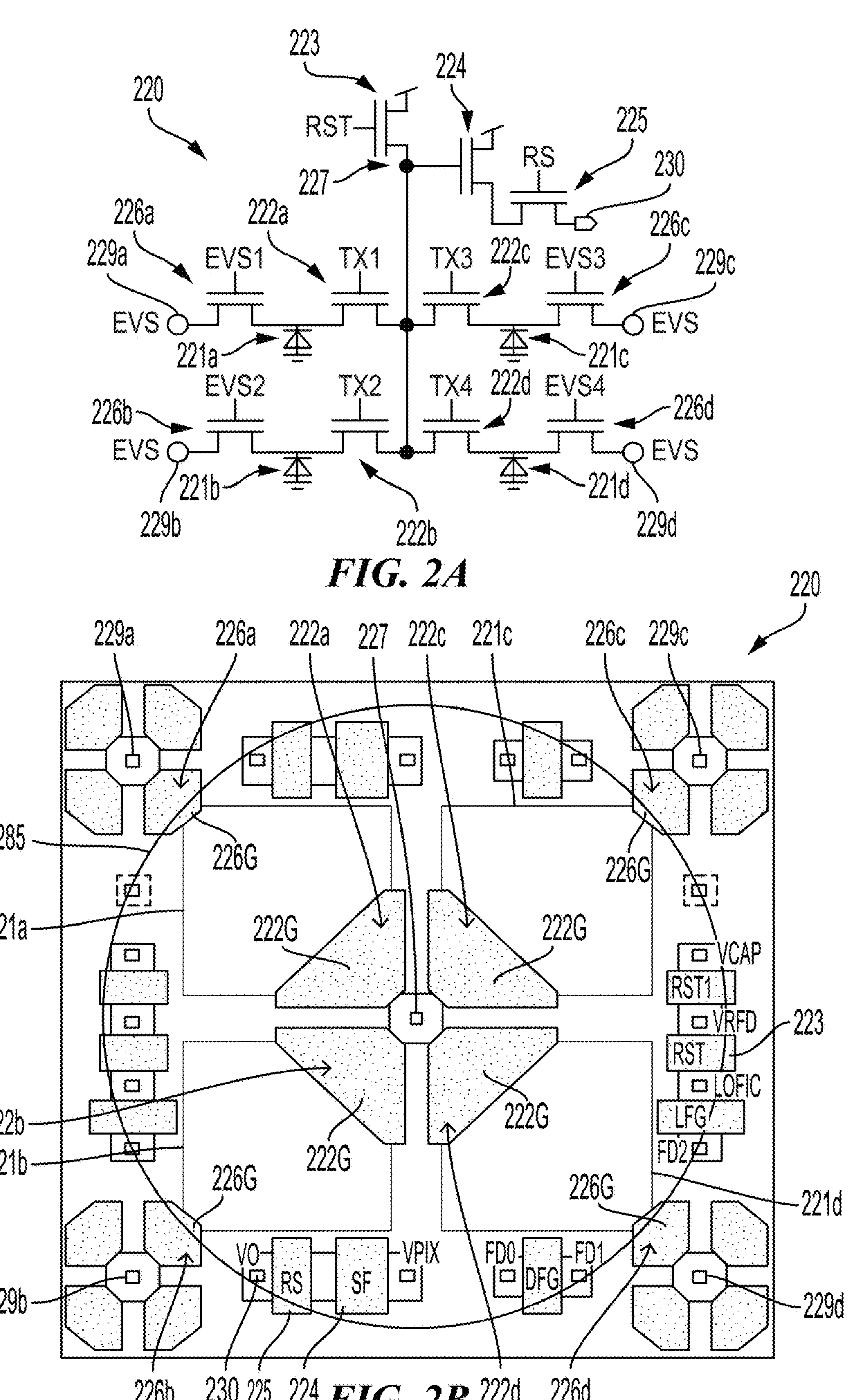
FIG. 2A is a partially schematic circuit diagram of a pixel configured in accordance with various embodiments of the present technology.
FIG. 2B is a partial schematic diagram illustrating an example pixel layout corresponding to the pixel of FIG. 2A.

FIG. 2A is a partially schematic circuit diagram of a pixel 220 configured in accordance with various embodiments of the present technology. The pixel 220 may be an example of one of the pixels of the pixel array 108 of FIG. 1, or of other pixels configured in accordance with various embodiments of the present technology. The pixel 220 is also referred to herein as "pixel arrangement 220." In the illustrated embodiment, the pixel 220 includes four photosensors 221 (identified individually in FIG. 2A as first through fourth photosensors 221*a*-221*d*), a floating diffusion 227, and four transfer gates 222G that correspond to four transfer transistors 222 (identified individually in FIG. 2A as first through fourth transfer transistors 222*a*-222*d*) that each selectively couples a corresponding one of the photosensors 221*a*-221*d* to the floating diffusion 227 based at least in part on a corresponding one of four transfer control signals TX1-TX4. The photosensors 221*a*-221*d* are each configured to photogenerate image charge (e.g., one or more electrons or holes) in response to incident light directed thereto, and the floating diffusion 227 is configured to receive image charge from each of the photosensors 221*a*-221*d* at least when the corresponding one of the transfer transistors 222*a*-222*d* (or first set of transfer transistors 222*a*-222*d*) is selectively activated (e.g., is turned on) using the corresponding one of the transfer control signal(s) TX1-TX4 (e.g., a transfer control signal with a positive voltage level). The transfer transistors 222*a*-222*d* are also referred to herein as "first switches 222*a*-222*d*."

The pixel 220 further includes a reset transistor 223, a source follower transistor 224, and a row select transistor 225. The reset transistor 223 can selectively couple the floating diffusion 227 to a voltage source such as reference voltage VRFD or pixel reference voltage (e.g., for reset operations) based at least in part on a reset signal RST. The source follower transistor 224 includes a gate terminal coupled to the floating diffusion 227. The source follower transistor 224 is also coupled between (i) a voltage source (e.g., the same voltage source as—or a different voltage source from—the voltage source to which the reset transistor 223 is coupled) and (ii) the row select transistor 225. The row select transistor 225 is (a) coupled between the source follower transistor 224 and a bitline 230, and (b) is selectively activated (e.g., is turned on) based at least in part on a row select signal RS. The source follower transistor 224 and the row select transistor 225 are collectively referred to herein as "CIS readout circuitry" or as simply "readout circuitry" of the pixel 220.

The pixel 220 further includes four transfer gates 226G that correspond to transfer transistors 226 (identified individually in FIG. 2A as first through fourth transfer transistors 226*a*-226*d* or second set of transfer transistors 226*a*-226*d*). As shown, each of the transfer transistors 226*a*-226*d* (also referred to herein as "second switches 226*a*-226*d*") selectively couples a corresponding one of the photosensors 221*a*-221*d* to a corresponding one of four EVS connections 229*a*-229*d* based at least in part on a corresponding one of four transfer control signals EVS1-EVS4. The EVS connections 229*a*-229*d* can each be coupled to EVS readout circuitry (e.g., to one or more of the event driven circuits included in the event driven sensing array 112 shown in FIG. 1). In some embodiments, the transfer transistors 226*a*-226*d* can be connected directly to a second semiconductor layer (e.g., the second die 104 of FIG. 1), such as via a copper-to-copper (Cu—Cu) bond. Continuing with this example, the second semiconductor layer can include the EVS readout circuitry.

FIG. 2B is a partially schematic diagram illustrating an example pixel layout corresponding to the pixel 220 of FIG. 2A. As shown, the floating diffusion 227 of the pixel 220 can be located in a central region of the pixel layout (e.g., in a central region of a semiconductor layer or material). The photosensors 221*a*-221*d* can be positioned generally about the floating diffusion 227 and can be selectively coupled to the floating diffusion 227 via the transfer transistors (or first set of transfer transistors) 222*a*-222*d*. Each of the transfer transistors 222*a*-222*d* can have a respective transfer gate 222G that is positioned at a location between at least one of the photosensors 221*a*-221*d* and the floating diffusion 227. The EVS connections 229*a*-229*d* can be diagonally offset from the floating diffusion 227 and/or generally positioned at corners of the layout. As described in greater detail below, such positioning of the EVS connections 229*a*-229*d* can facilitate sharing the EVS connections 229*a*-229*d* with pixels that neighbor or are positioned adjacent to the pixel 220. The photosensors 221*a*-221*d* can each be selectively coupled to a corresponding one of the EVS connections 229*a*-229*d* via a corresponding one of the transfer transistors (or second set of transfer transistors) 226*a*-226*d*. Each of the transfer transistors 226*a*-226*d* can have a respective transfer gate 226G that is positioned at a location between the respective photosensor and the corresponding one of the EVS connections 229*a*-229*d*. Example positions for the reset transistor 223, the source follower transistor 224, the row select transistor 225, and the bitline 230 are also shown in FIG. 2B.

In some embodiments, the pixel 220 can include a microlens 285 positioned over at least part of the photosensors 221*a*-221*d*. Additionally, or alternatively, the pixel 220 can implement a high dynamic range (HDR) readout structure. For example, as shown in FIG. 2B, the pixel 220 can include a lateral overflow integration capacitor LOFIC, a plurality of floating diffusions (e.g., floating diffusions FD0-FD2), and/or corresponding control gates (e.g., control gate DFG, control gate LFG).

Referring to FIGS. 2A and 2B together, each of the photosensors 221*a*-221*d* of the pixel 220 includes a (e.g., dedicated) pair of transfer gates 222G, 226G that is configured to guide current photogenerated by the respective photosensor 221*a*-221*d* to either the floating diffusion 227 (e.g., for CIS readout or normal image readout via the readout circuitry of the pixel 220) or a corresponding one of the EVS connections 229*a*-229*d* (e.g., for EVS readout via EVS readout circuitry). Each of the photosensors 221*a*-221*d* can be positioned between each respective floating diffusion 227 and a respective EVS floating diffusion that is coupled to EVS connections 229*a*-229*d* along a diagonal direction. At least one of the reset transistor 223, the source follower transistor 224, or row select transistor can be arranged between adjacent EVS floating diffusions.

More specifically, referring to the first photosensor 221*a* as an example, the transfer transistor 222*a* and the transfer transistor 226*a* can form a first pair of transfer transistors (or a first pair of transfer gates 222G, 226G). When the transfer transistor 222*a* is selectively activated based at least in part on the transfer control signal TX1 while the transfer transistor 226*a* is deactivated, image charge (e.g., one or more electrons or holes) photogenerated by the first photosensor 221*a* can be transferred to the floating diffusion 227 (e.g., for CIS readout). Stated another way, activating the transfer transistor 222*a* while leaving the transfer transistor 226*a* deactivated can facilitate reading out CIS information (e.g., intensity or luminance information corresponding to light incident on the first photosensor 221*a*, a CIS image signal) from the pixel 220 onto the bitline 230 via the readout circuitry of the pixel 220. On the other hand, when the transfer transistor 226*a* is selectively activated based at least in part on the transfer control signal EVS1 while the transfer transistor 222*a* is deactivated, image charge (e.g., one or more electrons or holes) photogenerated by the first photosensor 221*a* can be transferred to the EVS connection 229*a* (e.g., for EVS readout). Stated another way, activating the transfer transistor 226*a* while leaving the transfer transistor 222*a* deactivated can facilitate reading out non-CIS information (e.g., contrast information or intensity change information corresponding to light incident on the first photosensor 221*a*, one or more event signals) from the pixel 220 to EVS readout circuitry coupled to the pixel 220 via the EVS connection 229*a*. Thus, the first pair of transfer transistors (the transfer transistor 222*a* and the transfer transistor 226*a*) can be operated to obtain either CIS information or non-CIS information from the pixel 220 corresponding to light incident on the first photosensor 221*a*. In other words, the first pair of transfer transistors can be used to switch the portion of the pixel 220 corresponding to the first photosensor 221*a* between a CIS mode and an EVS mode. Thus, the first pair of transfer transistors can be referred to herein as a "mode switch" for the first photosensor 221*a*. The other pairs of transfer transistors for the other photosensors 221*b*-221*d* can be similarly operated.

Figure 2C:
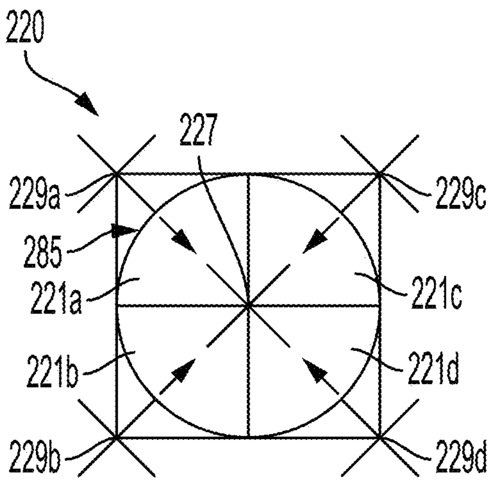
FIGS. 2C-2E are partial schematic diagrams of the pixel of FIGS. 2A and 2B.
Figure 2D:
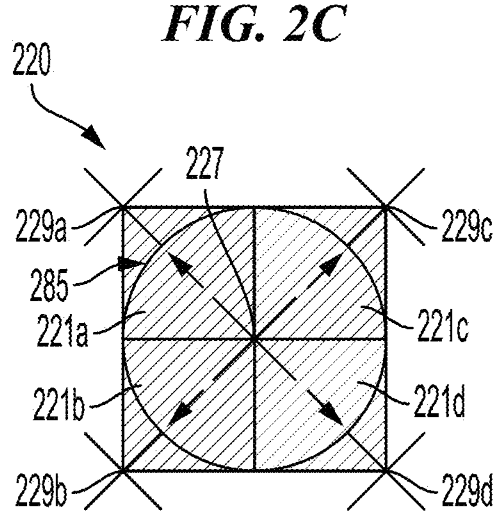
Figure 2E:
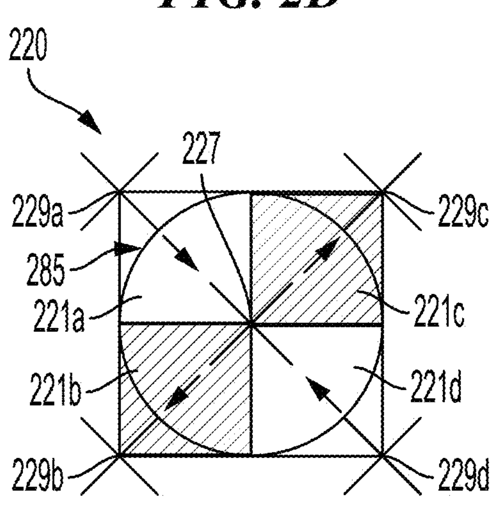

In some embodiments, the first pair of transfer transistors can be operated in tandem with the other pairs of the transfer transistors for the other photosensors 221*b*-221*d* of the pixel 220 to achieve a desired ratio of photosensors used to obtain CIS information to photosensors used to obtain non-CIS information. For example, FIGS. 2C-2E are partially schematic diagrams of the pixel 220 of FIGS. 2A and 2B. Referring to FIGS. 2A and 2C, CIS information can be obtained from each of the photosensors 221*a*-221*d* by (a) activating the transfer transistors 222*a*-222*d* using the transfer control signals TX1-TX4 while (b) leaving the transfer transistors 226*a*-226*d* deactivated. As best shown by the arrows in FIG. 2C, activating the transfer transistors 222*a*-222*d* while leaving the transfer transistors 226*a*-226*d* deactivated can transfer image charge generated by each of the photosensors 221*a*-221*d* to the floating diffusion 227. In some embodiments, the transfer transistors 222*a*-222*d* can be operated such that they are placed in an activated state together or at same (e.g., overlapping) times. In these embodiments, image charge generated by the photosensors 221*a*-221*d* can be transferred to the floating diffusion 227, binned, and read out of the pixel 220 onto the bitline 230 together. In other embodiments, two or more of the transfer transistors 222*a*-222*d* can be operated such that they are placed in the activated state at different (e.g., non-overlapping) times. This can facilitate obtaining separate CIS image signals from two or more of the photosensors 221*a*-221*d* corresponding to the two or more transfer transistors 222*a*-222*d*. As described in greater detail below, when all four of the photosensors 221*a*-221*d* of the pixel 220 are operated to obtain CIS information, the pixel 220 can be referred to as being operated in a "CIS only mode" of operation. Thus, FIG. 2C illustrates a CIS only mode of the pixel 220.

Referring now to FIGS. 2A and 2D, non-CIS information can be obtained from each of the photosensors 221*a*-221*d* by (a) activating the transfer transistors 226*a*-226*d* using the transfer control signals EVS1-EVS4 while (b) leaving the transfer transistors 222*a*-222*d* deactivated. As best shown by the arrows in FIG. 2D, activating the transfer transistors 226*a*-226*d* while leaving the transfer transistors 222*a*-222*d* deactivated can transfer image charge generated by each of the photosensors 221*a*-221*d* to a corresponding EVS floating diffusion that is coupled to a corresponding one of the EVS connections 229*a*-229*d*. The transfer transistors 226*a*-226*d* can be operated such that they (a) are placed in an activated state together or at same (e.g., overlapping) times, or (b) are placed in the activated state at different (e.g., non-overlapping) times. As described in greater detail below, when all four of the photosensors 221*a*-221*d* of the pixel 220 are operated to obtain non-CIS information, the pixel 220 can be referred to as being operated in an "EVS only mode" of operation. Thus, FIG. 2D illustrates an EVS only mode of the pixel 220.

Referring now to FIGS. 2A and 2E, CIS information can be obtained from a first subset of the photosensors 221*a*-221*d* while non-CIS information can be obtained from a second subset of the photosensors 221*a*-221*d*. The first subset can include one, two, or three of the photosensors 221*a*-221*d*. Additionally, or alternatively, the second subset can include one, two, or three of the photosensors 221*a*-221*d*, but not all the photosensors included in the pixel 220 as illustrated in FIG. 2E. In the specific example shown in FIG. 2E, CIS information can be obtained from the first photosensor 221*a* and the fourth photosensor 221*d* (e.g., by activating the transfer transistors 222*a* and 222*d* while leaving the transfer transistors 226*a* and 226*d* deactivated), and non-CIS information can be obtained from the second photosensor 221*b* and the third photosensor 221*c* (e.g., by activating the transfer transistors 226*b* and 226*c* while leaving the transfer transistors 222*b* and 222*c* deactivated). In some embodiments, image charge photogenerated by the first photosensor 221*a* and the fourth photosensor 221*d* can be transferred to the floating diffusion 227 at a same time, binned, and read out onto the bitline 230 via the readout circuitry of the pixel 220. In other embodiments, image charge photogenerated by the first photosensor 221*a* can be transferred to the floating diffusion 227 and readout onto the bitline 230 via the readout circuitry at a different timing from image charge photogenerated by the fourth photosensor 221*d*. As described in greater detail below, when a first subset of the photosensors 221*a*-221*d* are used to obtain CIS information while a second subset of the photosensors 221*a*-221*d* are used to obtain non-CIS information, the pixel 220 can be referred to as being operated in a "hybrid CIS and EVS mode" of operation. Thus, FIG. 2E illustrates a hybrid CIS and EVS mode of the pixel 220.

As discussed above, the transfer transistors 222*a*-222*d* and the transfer transistors 226*a*-226*d* of the pixel 220 therefore facilitate operating the pixel 220 in any one of three modes of operation: a CIS only mode (also referred to herein as a "first mode") in which all of the photosensors 221*a*-221*d* of the pixel 220 can be used to obtain or provide CIS information (e.g., intensity or luminance information, CIS image signals); a hybrid CIS and EVS mode (also referred to herein as a "hybrid mode" or a "second mode") in which the photosensors 221*a*-221*d* of the pixel 220 can be used to (e.g., simultaneously) obtain or provide CIS information and non-CIS information (e.g., contrast change information, intensity change information, event signals, event detection, phase detection auto-focus, depth sensing information, etc.); and an EVS only mode (also referred to herein as a "third mode") in which all of the photosensors 221*a*-221*d* of the pixel 220 can be used to obtain or provide non-CIS information. Stated another way, the transfer transistors 222*a*-222*d* and the transfer transistors 226*a*-226*d* of the pixel 220 can be used to transition the pixel 220 between (a) one or more first modes (e.g., the CIS only mode and/or the hybrid CIS and EVS mode) in which the pixel 220 is controllable to output CIS information corresponding to light incident on one or more of the photosensors 221*a*-221*d* of the pixel 220, and (b) one or more second modes (e.g., the hybrid CIS and EVS mode and/or the EVS only mode) in which the pixel 220 is controllable to output non-CIS information corresponding to light incident on one or more of the photosensors 221*a*-221*d*. Therefore, the transfer transistors 222*a*-222*d* and the transfer transistors 226*a*-226*d* of the pixel 220 can collectively be referred to herein as a "mode switch" of the pixel 220.

Although illustrated with four photosensors 221*a*-221*d* in FIGS. 2A-2E, the pixel 220 can include a different number of photosensors (e.g., one, two, three, or more than four photosensors) in other embodiments of the present technology. Additionally, although illustrated with two control gates per photosensor in FIGS. 2A and 2B, the pixel 220 can include a different number of control gates in other embodiments of the present technology. For example, the first transfer transistor 226*a* and/or the fourth transfer transistor 226*d* can be omitted in some embodiments, such as in embodiments in which the first photosensor 221*a* and/or the fourth photosensor 221*d* are only used to generate and output non-CIS information. As another example, multiple photosensors (e.g., the first photosensor 221*a* and the second photosensor 221*b*) can share transfer gates (e.g., as opposed to each photosensor having its own unique or dedicated pair of transfer gates).

Figures 3A, 3B, 3C:
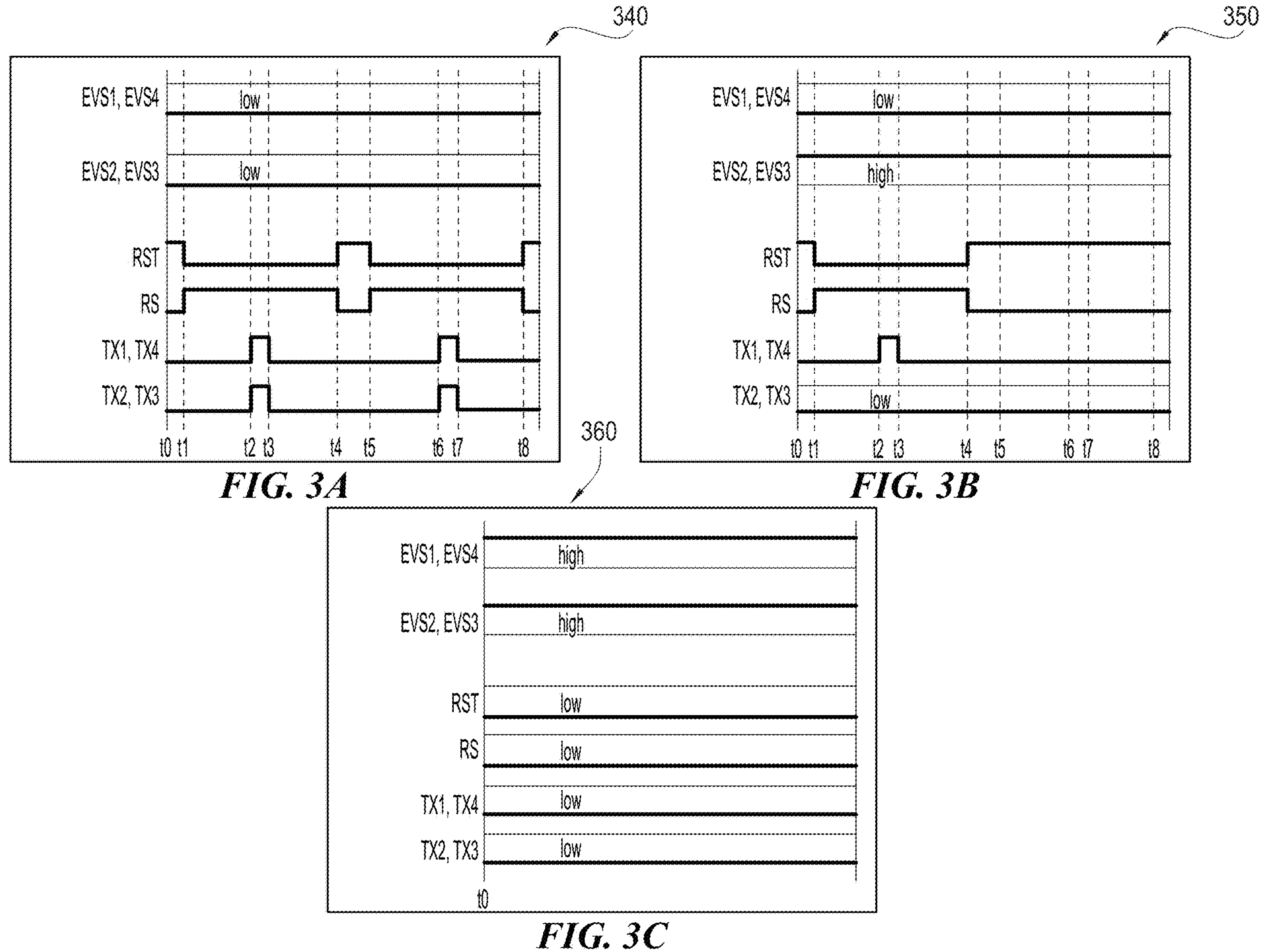
FIGS. 3A-3C are timing diagrams corresponding to various operating modes of the pixel of FIG. 2A in accordance with various embodiments of the present technology.

FIGS. 3A-3C are timing diagrams 340, 350, and 360, respectively, that correspond to the pixel 220 of FIGS. 2A and 2B. More specifically, the timing diagram 340 of FIG. 3A corresponds to readout of the pixel 220 while the pixel 220 is operated in the CIS only mode during a binning operation in which the transfer control signals TX1-TX4 are asserted and de-asserted together/simultaneously, the timing diagram 350 of FIG. 3B corresponds to readout of the pixel 220 while the pixel 220 is operated in a hybrid CIS and EVS mode, and the timing diagram 360 of FIG. 3C corresponds to readout of the pixel 220 while the pixel 220 is operated in the EVS only mode.

Referring first to FIGS. 2A and 3A to describe the CIS only mode of the pixel 220, at time t0 of the timing diagram 340, the transfer control signals TX1-TX4 and EVS1-EVS4 are all unasserted such that the transfer transistors 222*a*-222*d* and 226*a*-226*d*, respectively, are deactivated. In some embodiments, the transfer control signals EVS1-EVS4 can remain unasserted for the remainder of the time shown in the timing diagram 340. In other embodiments, one or more of the transfer control signals EVS1-EVS4 can be pulsed at one or more timings between time t0 and time t8, such as to activate one or more of the transfer transistors 226*a*-226*d* to provide an anti-blooming path to one or more of the photosensors 221*a*-221*d*. Providing an anti-blooming path to one or more of the photosensors 221*a*-221*d* can drain excess image charge through one or more of the EVS connections 229*a*-229*d* (e.g., through a power supply node of corresponding EVS readout circuitry) and/or prevent one or more of the photosensors 221*a*-221*d* from becoming saturated during the integration/exposure period. In other words, at least while the pixel 220 is operated in the CIS only mode, one or more of the transfer transistors 226*a*-226*d* can be operated as an anti-blooming/anti-eclipse transistor.

Referring again to the timing diagram 340 of FIG. 3A, at time t0, the reset signal RST can be in an asserted state such that the reset transistor 223 is activated, and the row select signal RS can be in an unasserted state such that the row select transistor 225 is deactivated. As such, the floating diffusion 227 can be reset via the reset transistor 223 at time t0. The interval of time between time t0 and time t1 may be referred to as a reset or precharge period of the pixel.

At time t1, the reset signal RST is unasserted while the row select signal RS is asserted. As such, the reset transistor 223 is deactivated, and the row select transistor 225 is activated. In some embodiments, a first reset level signal (corresponding to charge on the floating diffusion 227 after resetting the floating diffusions 227) can be sampled and read out of the pixel 220 onto the bitline 230 (e.g., for correlated double sampling) between time t1 and time t2. The interval of time between time t1 and time t2 may be referred to as an integration or exposure period of the pixel.

At time t2, the transfer control signals TX1-TX4 are asserted, thereby activating the transfer transistors 222*a*-222*d* of the pixel 220. Activation of the transfer transistors 222*a*-222*d* couples the photosensors 221*a*-221*d* of the pixel 220 to the floating diffusion 227. Activation of the transfer transistor 222*a*-222*d* also allows charge photogenerated by the photosensors 221*a*-221*d* in response to incident light to be (a) transferred to the floating diffusion 227 and (b) applied to the gate of the source follower transistor 224. Because the row select signal RS remains asserted between time t1 and time t4, a first signal level signal (corresponding to image charge that was (i) photogenerated by the photosensors 221*a*-221*d* and (ii) applied to the gate of the source follower transistor 224 between time t2 and time t3) is sampled and read out of the pixel 220 onto the bitline 230 between time t2 and time t3. At time t3, the transfer control signals TX1-TX4 can be unasserted, thereby deactivating the transfer transistors 222*a*-222*d* and uncoupling the photosensors 221*a*-221*d* from the floating diffusion 227.

At time t4, the reset signal RST is again asserted to activate the reset transistor 223 while the row select signal RS is unasserted to deactivate the row select transistor 225. In turn, the floating diffusion 227 is reset via the reset transistor 223 between time t4 and time t5.

At time t5, the reset signal RST is unasserted while the row select signal RS is asserted. As such, the reset transistor 223 is deactivated, and the row select transistor 225 is activated. In some embodiments, a second reset level signal (corresponding to charge on the floating diffusion 227 after resetting the floating diffusion 227) can be sampled and read out of the pixel 220 onto the bitline 230 (e.g., for correlated double sampling) between time t5 and time t6.

At time t6, the transfer control signals TX1-TX4 are asserted, thereby activating the transfer transistors 222*a*-222*d* of the pixel 220. Activation of the transfer transistors 222*a*-222*d* couples the photosensors 221*a*-221*d* of the pixel 220 to the floating diffusion 227. Activation of the transfer transistors 222*a*-222*d* also allows charge photogenerated by the photosensors 221*a*-221*d* in response to incident light to be (a) transferred to the floating diffusion 227 and (b) applied to the gate of the source follower transistor 224. Because the row select signal RS remains asserted between time t6 and time t7, a second signal level signal (corresponding to image charge that was (i) photogenerated by the photosensors 221*a*-221*d* and (ii) applied to the gate of the source follower transistor 224 between time t6 and time t7) is sampled and read out of the pixel 220 onto the bitline 230 between time t6 and time t7. At time t7, the transfer control signals TX1-TX4 are unasserted, thereby deactivating the transfer transistors 222*a*-222*d* and uncoupling the photosensors 221*a*-221*d* from the floating diffusion 227. The interval of time between time t4 and time t7 may be referred to as a readout period of the pixel.

At time t8, the reset signal RST is again asserted to activate the reset transistor 223 while the row select signal RS is unasserted to deactivate the row select transistor 225 (e.g., to reset the charge on the floating diffusion 227).

Although shown as asserted at the same times in the timing diagram 340 shown in FIG. 3A, one or more of the transfer control signals TX1-TX4 can be asserted at different times from others of the transfer control signals TX1-TX4. For example, a CIS image signal corresponding to light incident on the first photosensor 221*a* and the fourth photosensor 221*d* can be read out separately from a CIS image signal corresponding to light incident on the second photosensor 221*b* and the third photosensor 221*c*, such as by asserting the transfer control signals TX1 and TX4 at different (non-overlapping) timings from the transfer control signals TX2 and TX3. As another example, a separate CIS image signal can be read out for each of the photosensors 221*a*-221*d*, such as by individually asserting the transfer control signals TX1-TX4 at different (non-overlapping) timings from one another. In some embodiments, in full resolution mode, the four photosensors 221*a*-221*d* can be read-out sequentially by sequentially activating the transfer control signals TX1-TX4 one at a time.

Referring now to FIGS. 2A and 3B to describe a hybrid CIS and EVS mode of the pixel 220, at time t0 of the timing diagram 350, the transfer control signals EVS1 and EVS4 are unasserted (such that the transfer transistors 226*a* and 226*d* of the pixel 220 are deactivated) while the transfer control signals EVS2 and EVS3 are asserted (such that the transfer transistors 226*b* and 226*c* are activated). As such, the first photosensor 221*a* and the fourth photosensor 221*d* are uncoupled from the corresponding EVS connections 229*a* and 229*d* while the second photosensor 221*b* and the third photosensor 221*c* are coupled to the corresponding EVS connections 229*b* and 229*c*. Thus, image charge photogenerated by the second photosensor 221*b* and the third photosensor 221*c* can be transferred to EVS readout circuitry corresponding to the EVS connections 229*b* and 229*c*. In turn, the EVS readout circuitry can generate a contrast change signal (e.g., an event signal). A change in contrast above a threshold (e.g., a change in intensity of light incident on the second photosensor 221*b* and/or the third photosensor 221*c* from darker to brighter and greater than a threshold, a change in intensity of light incident on the second photosensor 221*b* and/or the third photosensor 221*c* from brighter to darker and greater than a threshold) can indicate an event (e.g., motion) has occurred within an external scene monitored by the pixel 220, and can trigger corresponding EVS readout circuitry to trigger an event detection signal that indicates that the pixel 220 has detected an event in the scene.

As shown in FIG. 3B, the transfer control signals EVS2 and EVS3 can remain asserted for the entire duration of time shown in the timing diagram 350. As such, the transfer transistors 226*b* and 226*c* can remain activated for the entire duration of time shown in the timing diagram 350. Thus, the second and third photosensors 221*b* and 221*c* can remain coupled to the EVS connections 229*b* and 229*c*, respectively, for the entire duration of time shown in the timing diagram 350. In other words, the second and third photosensors 221*b* and 221*c* can be used to detect events for the entire duration of time between time t0 and time t8 in the timing diagram 350 of FIG. 3B.

In addition, the transfer control signals EVS1 and EVS4 can remain unasserted for the entire duration of time shown in the timing diagram 350 such that the transfer transistors 226*a* and 226*d* can remain deactivated for the entire duration of time. Thus, the first photosensor 221*a* and the fourth photosensor 221*d* can remain uncoupled from the EVS connections 229*a* and 229*d*, respectively, for the entire duration of time shown in the timing diagram 350. Alternatively, one or both of the transfer control signals EVS1 and EVS4 can be pulsed at one or more timings between time t0 and time t8, such as to activate one or both of the transfer transistors 226*a* and 226*d* to provide an anti-blooming path to one or both of the photosensors 221*a* and 221*d*. Providing an anti-blooming path to one or both of the photosensors 221*a* and 221*d* can drain excess image charge through one or both of the EVS connections 229*a* and 229*d* (e.g., through the power supply node of corresponding EVS readout circuitry) and/or prevent one or both of the photosensors 221*a* and 221*d* from becoming saturated during the integration/exposure period. In other words, at least when the first photosensor 221*a* and/or the fourth photosensor 221*d* of the pixel 220 is/are used to obtain CIS information (e.g., intensity information) corresponding to an external scene, one or both of the transfer transistors 226*a* and 226*d* can be operated as an anti-blooming/anti-eclipse transistor.

As shown at time t0 of the timing diagram 350 of FIG. 3B, a reset signal RST can also be in an asserted state such that the reset transistor 223 is activated, and the row select signal RS can be in an unasserted state such that the row select transistor 225 is deactivated. In addition, all of the transfer control signals TX1-TX4 are unasserted, such that the transfer transistors 222*a*-222*d* of the pixel 220 are deactivated at time t0. As such, the floating diffusion 227 of the pixel 220 is reset via the reset transistor 223 at time t0.

At time t1, the reset signal RST is unasserted while the row select signal RS is asserted. As such, the reset transistor 223 is deactivated, and the row select transistor 225 is activated. In some embodiments, a first reset level signal (corresponding to charge on the floating diffusion 227 after resetting the floating diffusion 227) can be sampled and read out of the pixel 220 onto the bitline 230 (e.g., for correlated double sampling) between time t1 and time t2.

At time t2, the transfer control signals TX1 and TX4 are asserted, thereby activating the transfer transistors 222*a* and 222*d* of the pixel 220. Activation of the transfer transistors 222*a* and 222*d* (i) couples the first photosensor 221*a* and the fourth photosensor 221*d*, respectively, of the pixel 220 to the floating diffusion 227, and (ii) allows charge photogenerated by the first photosensor 221*a* and the fourth photosensor 221*d* in response to incident light to be (a) transferred to the floating diffusion 227 and (b) applied to the gate of the source follower transistor 224. Because the row select signal RS remains asserted between time t1 and time t4, a first signal level signal (corresponding to image charge that was (i) photogenerated by the first photosensor 221*a* and/or the fourth photosensor 221*d* and (ii) applied to the gate of the source follower transistor 224 between time t2 and time t3) is sampled and read out of the pixel 220 onto the bitline 230 between time t2 and time t3. At time t3, the transfer control signals TX1 and TX4 are unasserted, thereby deactivating the transfer transistors 222*a* and 222*d*, respectively, and uncoupling the first photosensor 221*a* and the fourth photosensor 221*d*, respectively, from the floating diffusion 227.

At time t4, the reset signal RST is again asserted to activate the reset transistor 223 while the row select signal RS is unasserted to deactivate the row select transistor 225. In turn, the floating diffusion 227 is reset via the reset transistor 223. As shown, the reset signal RST can remain asserted while the row select signal RS can remain unasserted for the remaining duration of time shown in the timing diagram 350 such that the pixel 220 is disconnected from the bitline 230.

Although shown as asserted at the same times in the timing diagram 350 shown in FIG. 3B, the transfer control signals TX1 and TX4 can be asserted at different times in other embodiments. For example, a CIS image signal corresponding to light incident on the first photosensor 221*a* can be read out separately from a CIS image signal corresponding to light incident on the fourth photosensor 221*d*, such as by asserting the transfer control signal TX1 at different (non-overlapping) timings from the transfer control signal TX4.

Referring now to FIGS. 2A and 3C to describe the EVS only mode of the pixel 220, at time t0 of the timing diagram 360, the transfer control signals EVS1-EVS4 are all asserted while the transfer control signals TX1-TX4 are all unasserted. As such, the transfer transistors 226*a*-226*d* of the pixel 220 are all activated while the transfer transistors 222*a*-222*d* of the pixel 220 are all deactivated. Thus, each of the photosensor 221*a*-221*d* of the pixel 220 is uncoupled from the floating diffusion 227 and is coupled to a corresponding one of the EVS connections 229*a*-229*d*. Therefore, image charge photogenerated by any one of the photosensors 221*a*-221*d* can be transferred to respective EVS readout circuitry via the corresponding one of the EVS connections 229*a*-229*d*. In turn, the EVS readout circuitry can generate a contrast change signal (e.g., an event signal). A change in contrast above a threshold (e.g., a change in intensity of light incident on the one of the photosensors 221*a*-221*d* from darker to brighter and greater than a threshold, a change in intensity of light incident on the one of the photosensors 221*a*-221*d* from brighter to darker and greater than a threshold) can indicate an event (e.g., motion) has occurred within an external scene monitored by the pixel 220, and can trigger corresponding EVS readout circuitry to trigger an event detection signal that indicates that the pixel 220 has detected an event in the scene.

As shown in FIG. 3C, the transfer control signals EVS1-EVS4 can remain asserted and the transfer control signals TX1-TX4 can remain unasserted for the entire duration of time shown in the timing diagram 360. As such, the transfer transistors 226*a*-226*d* can remain activated and the transfer transistors 222*a*-222*d* can remain deactivated for the entire duration of time shown in the timing diagram 360. Thus, each of the photosensors 221*a*-221*d* can remain coupled to the corresponding one of the EVS connections 229*a*-229*d* for the entire duration of time shown in the timing diagram 360. In other words, each of the photosensors 221*a*-221*d* can be used to detect events for the entire duration of time between time t0 and time t8 in the timing diagram 360 of FIG. 3C.

As also shown in FIG. 3C, the reset signal RST and the row select signal RS are unasserted at time t0 and remain unasserted for the remainder of the time shown in the timing diagram 360. Therefore, the reset transistor 223 and the row select transistor 225, respectively, are deactivated at time t0 and remain deactivated for the remainder of the time shown in the timing diagram 360.

Although the hybrid CIS and EVS mode of the pixel 220 is described above in the context of using (a) the first photosensor 221*a* and the fourth photosensor 221*d* to generate and output CIS information from the pixel 220 and (b) the second photosensor 221*b* and the third photosensor 221*c* to generate and output non-CIS information from the pixel 220, the transfer transistors 222*a*-222*d* and the transfer transistors 226*a*-226*d* facilitate using different combinations of the photosensors 221*a*-221*d* to generate and output CIS information and/or non-CIS information. For example, FIGS. 4A-4L illustrate several possibilities for operating the pixel 220 in a hybrid CIS and EVS mode. The plurality of photosensors 221*a*-221*d* included in pixel 220 may be configured to have the same color spectra response (e.g., they may be disposed under a same color filter material). The plurality of photosensors 221*a*-221*d* included in pixel 220 may further be disposed under a common microlens.

Figures 4A, 4B, 4C, 4D, 4E, 4F, 4G, 4H, 4I, 4J, 4K, 4L:
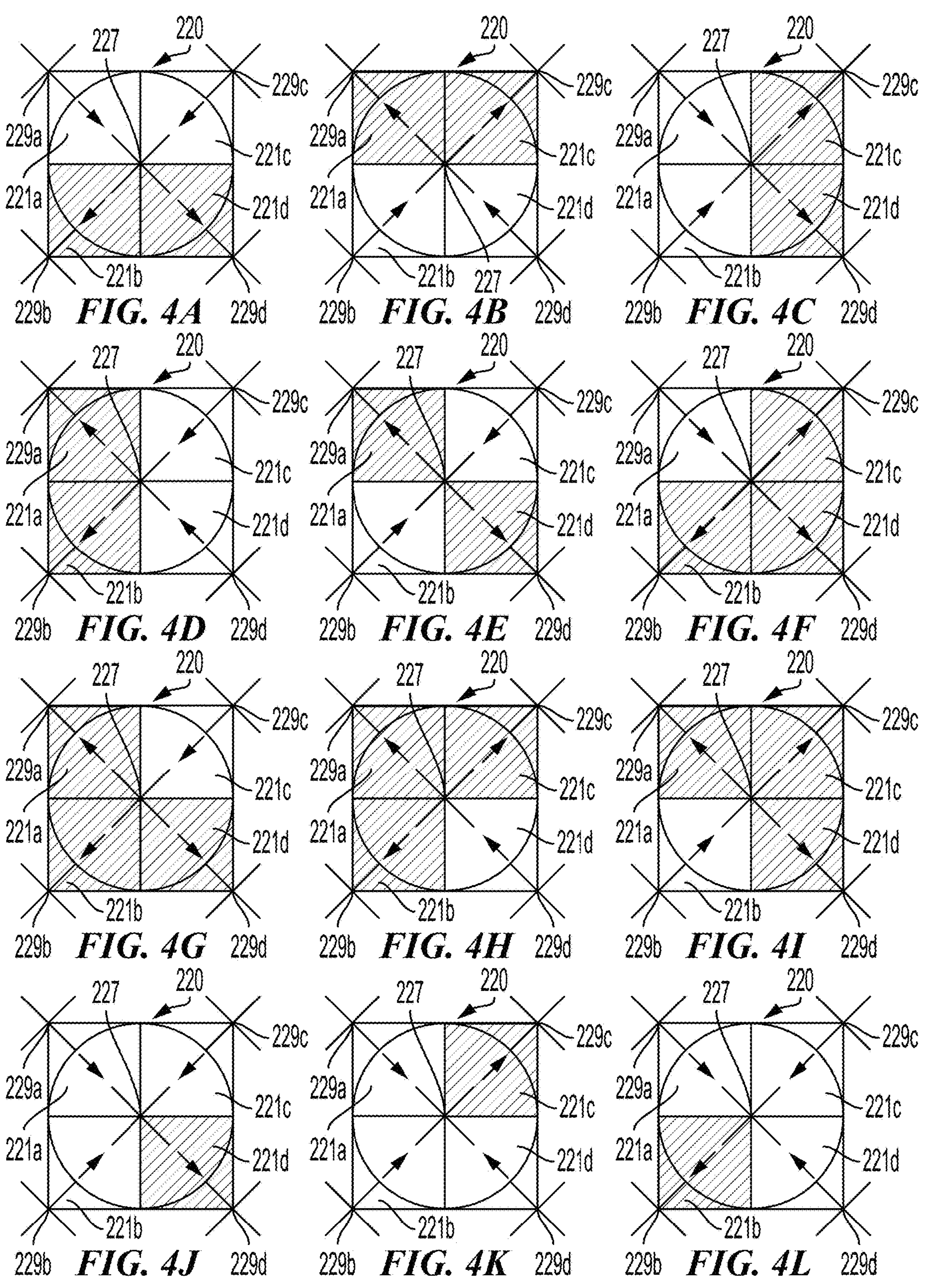
FIG. 4A-4L are partial schematic diagrams of the pixel of FIG. 2A illustrating several possibilities for operating the pixel in a hybrid CIS and EVS mode in accordance with various embodiments of the present technology.

In particular, FIG. 4A is a partial schematic diagram of the pixel 220 of FIGS. 2A and 2B illustrating one possibility for a hybrid CIS and EVS mode of the pixel 220 in which the first photosensor 221*a* and the third photosensor 221*c* are used to capture CIS information, and the second photosensor 221*b* and the fourth photosensor 221*d* are used to capture non-CIS information. In some embodiments, to place the pixel 220 of FIGS. 2A and 2B in the hybrid CIS and EVS mode illustrated in FIG. 4A, the transfer transistors 222*a*, 222*c*, 226*b*, and 226*d* can be activated while the transfer transistors 222*b*, 222*d*, 226*a*, and 226*c* are deactivated.

FIG. 4B is a partial schematic diagram of the pixel 220 of FIGS. 2A and 2B illustrating another possibility for a hybrid CIS and EVS mode of the pixel 220 in which the second photosensor 221*b* and the fourth photosensor 221*d* are used to capture CIS information, and the first photosensor 221*a* and the third photosensor 221*c* are used to capture non-CIS information. In some embodiments, to place the pixel 220 of FIGS. 2A and 2B in the hybrid CIS and EVS mode illustrated in FIG. 4B, the transfer transistors 222*b*, 222*d*, 226*a*, and 226*c* can be activated while the transfer transistors 222*a*, 222*c*, 226*b*, and 226*d* are deactivated.

FIG. 4C is a partial schematic diagram of the pixel 220 of FIGS. 2A and 2B illustrating still another possibility for a hybrid CIS and EVS mode of the pixel 220 in which the first photosensor 221*a* and the second photosensor 221*b* are used to capture CIS information, and the third photosensor 221*c* and the fourth photosensor 221*d* are used to capture non-CIS information. In some embodiments, to place the pixel 220 of FIGS. 2A and 2B in the hybrid CIS and EVS mode illustrated in FIG. 4C, the transfer transistors 222*a*, 222*b*, 226*c*, and 226*d* can be activated while the transfer transistors 222*c*, 222*d*, 226*a*, and 226*b* are deactivated.

FIG. 4D is a partial schematic diagram of the pixel 220 of FIGS. 2A and 2B illustrating yet another possibility for a hybrid CIS and EVS mode of the pixel 220 in which the third photosensor 221*c* and the fourth photosensor 221*d* are used to capture CIS information, and the first photosensor 221*a* and the second photosensor 221*b* are used to capture non-CIS information. In some embodiments, to place the pixel 220 of FIGS. 2A and 2B in the hybrid CIS and EVS mode illustrated in FIG. 4D, the transfer transistors 222*c*, 222*d*, 226*a*, and 226*b* can be activated while the transfer transistors 222*a*, 222*b*, 226*c*, and 226*d* are deactivated.

FIG. 4E is a partial schematic diagram of the pixel 220 of FIGS. 2A and 2B illustrating another possibility for a hybrid CIS and EVS mode of the pixel 220 in which the second photosensor 221*b* and the third photosensor 221*c* are used to capture CIS information, and the first photosensor 221*a* and the fourth photosensor 221*d* are used to capture non-CIS information. In some embodiments, to place the pixel 220 of FIGS. 2A and 2B in the hybrid CIS and EVS mode illustrated in FIG. 4E, the transfer transistors 222*b*, 222*c*, 226*a*, and 226*d* can be activated while the transfer transistors 222*a*, 222*d*, 226*b*, and 226*c* are deactivated.

FIG. 4F is a partial schematic diagram of the pixel 220 of FIGS. 2A and 2B illustrating still another possibility for a hybrid CIS and EVS mode of the pixel 220 in which the first photosensor 221*a* is used to capture CIS information, and the second photosensor 221*b*, the third photosensor 221*c*, and the fourth photosensor 221*d* are used to capture non-CIS information. In some embodiments, to place the pixel 220 of FIGS. 2A and 2B in the hybrid CIS and EVS mode illustrated in FIG. 4F, the transfer transistors 222*a*, 226*b*, 226*c*, and 226*d* can be activated while the transfer transistors 222*b*, 222*c*, 222*d*, and 226*a* are deactivated.

FIG. 4G is a partial schematic diagram of the pixel 220 of FIGS. 2A and 2B illustrating yet another possibility for a hybrid CIS and EVS mode of the pixel 220 in which the third photosensor 221*c* is used to capture CIS information, and the first photosensor 221*a*, the second photosensor 221*b*, and the fourth photosensor 221*d* are used to capture non-CIS information. In some embodiments, to place the pixel 220 of FIGS. 2A and 2B in the hybrid CIS and EVS mode illustrated in FIG. 4G, the transfer transistors 222*c*, 226*a*, 226*b*, and 226*d* can be activated while the transfer transistors 222*a*, 222*b*, 222*d*, and 226*c* are deactivated.

FIG. 4H is a partial schematic diagram of the pixel 220 of FIGS. 2A and 2B illustrating another possibility for a hybrid CIS and EVS mode of the pixel 220 in which the fourth photosensor 221*d* is used to capture CIS information, and the first photosensor 221*a*, the second photosensor 221*b*, and the third photosensor 221*c* are used to capture non-CIS information. In some embodiments, to place the pixel 220 of FIGS. 2A and 2B in the hybrid CIS and EVS mode illustrated in FIG. 4H, the transfer transistors 222*d*, 226*a*, 226*b*, and 226*c* can be activated while the transfer transistors 222*a*, 222*b*, 222*c*, and 226*d* are deactivated.

FIG. 4I is a partial schematic diagram of the pixel 220 of FIGS. 2A and 2B illustrating still another possibility for a hybrid CIS and EVS mode of the pixel 220 in which the second photosensor 221*b* is used to capture CIS information, and the first photosensor 221*a*, the third photosensor 221*c*, and the fourth photosensor 221*d* are used to capture non-CIS information. In some embodiments, to place the pixel 220 of FIGS. 2A and 2B in the hybrid CIS and EVS mode illustrated in FIG. 4I, the transfer transistors 222*b*, 226*a*, 226*c*, and 226*d* can be activated while the transfer transistors 222*a*, 222*c*, 222*d*, and 226*b* are deactivated.

FIG. 4J is a partial schematic diagram of the pixel 220 of FIGS. 2A and 2B illustrating yet another possibility for a hybrid CIS and EVS mode of the pixel 220 in which the first photosensor 221*a*, the second photosensor 221*b*, and the third photosensor 221*c* are used to capture CIS information, and the fourth photosensor 221*d* is used to capture non-CIS information. In some embodiments, to place the pixel 220 of FIGS. 2A and 2B in the hybrid CIS and EVS mode illustrated in FIG. 4J, the transfer transistors 222*a*, 222*b*, 222*c*, and 226*d* can be activated while the transfer transistors 222*d*, 226*a*, 226*b*, and 226*c* are deactivated.

FIG. 4K is a partial schematic diagram of the pixel 220 of FIGS. 2A and 2B illustrating another possibility for a hybrid CIS and EVS mode of the pixel 220 in which the first photosensor 221*a*, the second photosensor 221*b*, and the fourth photosensor 221*d* are used to capture CIS information, and the third photosensor 221*c* is used to capture non-CIS information. In some embodiments, to place the pixel 220 of FIGS. 2A and 2B in the hybrid CIS and EVS mode illustrated in FIG. 4K, the transfer transistors 222*a*, 222*b*, 222*d*, and 226*c* can be activated while the transfer transistors 222*c*, 226*a*, 226*b*, and 226*d* are deactivated.

FIG. 4L is a partially schematic diagram of the pixel 220 of FIGS. 2A and 2B illustrating still another possibility for a hybrid CIS and EVS mode of the pixel 220 in which the first photosensor 221*a*, the third photosensor 221*c*, and the fourth photosensor 221*d* are used to capture CIS information, and the second photosensor 221*b* is used to capture non-CIS information. In some embodiments, to place the pixel 220 of FIGS. 2A and 2B in the hybrid CIS and EVS mode illustrated in FIG. 4L, the transfer transistors 222*a*, 222*c*, 222*d*, and 226*b* can be activated while the transfer transistors 222*b*, 226*a*, 226*c*, and 226*d* are deactivated.

Although not shown, yet another possibility for a hybrid CIS and EVS mode of the pixel 220 can include using the second photosensor 221*b*, the third photosensor 221*c*, and the fourth photosensor 221*d* to capture CIS information while the first photosensor 221*a* is used to capture non-CIS information. In some embodiments, to place the pixel 220 in such a hybrid CIS and EVS mode, the transfer transistors 222*b*, 222*c*, 222*d*, and 226*a* can be activated while the transfer transistors 222*a*, 226*b*, 226*c*, and 226*d* are deactivated.

Figure 5:
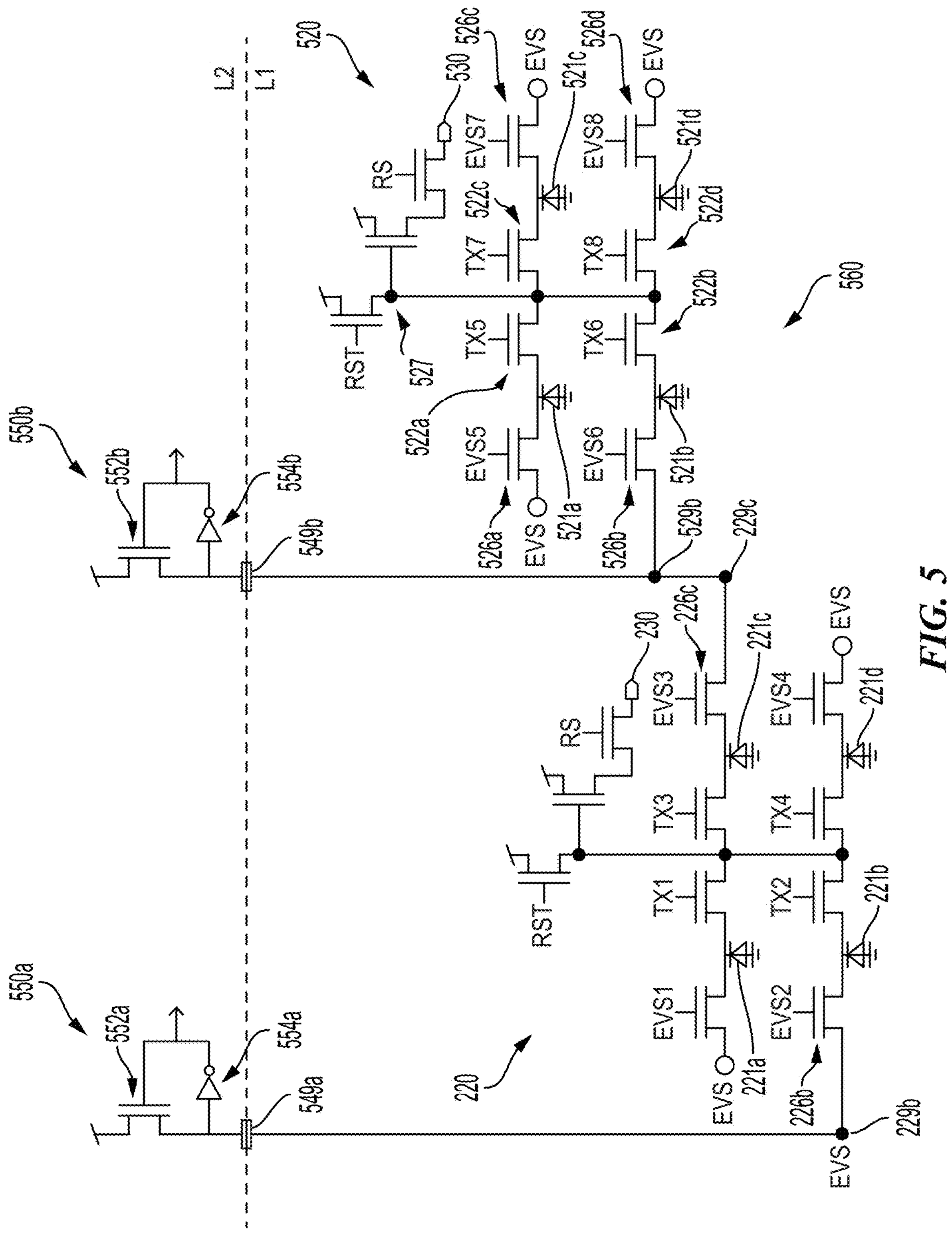
FIG. 5 is a partial schematic circuit diagram of a pixel arrangement configured in accordance with various embodiments of the present technology.

The principal concepts of the present technology discussed above with reference to FIGS. 1-4L can be applied in various image sensors, pixel arrangements, and/or pixel architectures. For example, FIG. 5 is a partially schematic circuit diagram of a pixel arrangement 560 configured in accordance with various embodiments of the present technology. As shown, the pixel arrangement 560 includes the pixel 220 of FIGS. 2A and 2B described above and a pixel 520. As shown, the pixel 520 is generally similar to the pixel 220. Thus, similar reference numbers are used in FIG. 5 to denote identical or at least generally similar components across the pixel 220 and the pixel 520. In some embodiments, the pixel 520 can be an example of one of the pixels of the pixel array 108 of FIG. 1 or of other pixels configured in accordance with various embodiments of the present technology.

The pixel 520 includes four photosensors 521 (identified individually in FIG. 5 as first through fourth photosensors 521*a*-521*d*) that are each selectively coupled to a floating diffusion 527 via a corresponding one of four transfer transistors 522 (identified individually in FIG. 5 as first through fourth transfer transistors 522*a*-522*d*) based at least in part on transfer control signals TX5-TX8. In some embodiments, one or more of the transfer control signals TX5-TX8 can be or correspond to one or more of the transfer control signals TX1-TX4 used to control the transfer transistors 222*a*-222*d* of the pixel 220. In these and other embodiments, one or more of the transfer control signals TX5-TX8 can be different control signals from one or more of the transfer control signals TX1-TX4 used to control the transfer transistors 222*a*-222*d* of the pixel 220.

The pixel 520 further includes four transfer transistors 526 (identified individually in FIG. 5 as first through fourth transfer transistors 526*a*-526*d*) that each selectively couple a corresponding one of the photosensors to a corresponding one of four EVS connections 529 based at least in part on transfer control signals EVS5-EVS8. In some embodiments, one or more of the transfer control signals EVS5-EVS8 can be or correspond to one or more of the transfer control signals EVS1-EVS4 used to control the transfer transistors 226*a*-226*d* (or the second set of transfer transistors 226*a*-226*d*) of the pixel 220. In these and other embodiments, one or more of the transfer control signals EVS5-EVS8 can be different control signals from one or more of the transfer control signals EVS1-EVS4 used to control the transfer transistors 226*a*-226*d* (or the second set of transfer transistors 226*a*-226*d*) of the pixel 220.

The pixel 520 further includes a reset transistor and readout circuitry. The readout circuitry can include a source follower transistor, and a row select transistor coupled between the source follower transistor and a bitline 530.

As discussed above, each of the EVS connections 229*a*-229*d* of the pixel 220 can be coupled to corresponding EVS readout circuitry. In the illustrated embodiment, the EVS connection 229*b* of the pixel 220 is coupled to a first logarithmic amplifier 550*a* via a bond 549*a*. The first logarithmic amplifier 550*a* can be part of first EVS readout circuitry positioned on another semiconductor layer L2 (e.g., the second die 104 of FIG. 1) different from the semiconductor layer L1 (e.g., the first die 102 of FIG. 1) on which the pixel 220 is located. The bond 549*a* can be a hybrid bond, a Cu—Cu bond, or another suitable type of bond.

In addition, the EVS connection 229*c* of the pixel 220 is coupled to a second logarithmic amplifier 550*b* via a bond 549*b*. The second logarithmic amplifier 550*b* can be part of second EVS readout circuitry positioned on the other semiconductor layer L2. Similar to the bond 549*a*, the bond 549*b* can be a hybrid bond, a Cu—Cu bond, or another suitable type of bond.

As shown, the first logarithmic amplifier 550*a* includes (i) an inverter 554*a* having an input and an output, and (ii) a transistor 552*a* with a drain coupled to a voltage supply, a source coupled to the bond 549*a* and to the input of the inverter 554*a*, and a gate coupled to the output of the inverter 554*a*. The output of the inverter 554*a* can correspond to an output of the first logarithmic amplifier 550*a*. In the illustrated embodiment, the second logarithmic amplifier 550*b* is generally similar to the first logarithmic amplifier 550*a* and includes an inverter 554*b* and a transistor 552*b*.

EVS readout circuitry on the second semiconductor layer L2 can be shared by multiple (e.g., neighboring, adjacent) pixels on the first semiconductor layer L1. For example, the second readout circuitry corresponding to the second logarithmic amplifier 550*b* can be shared by the pixel 220 and the pixel 520. More specifically, as shown in FIG. 5, the EVS connection 229*c* of the pixel 220 and an EVS connection 529*b* of the pixel 520 can both be coupled to the second logarithmic amplifier 550*b* of the second EVS readout circuitry via the bond 549*b*. Therefore, the second EVS readout circuitry can be used (a) to detect events based on non-CIS information (e.g., contrast change information) output from the pixel 220 that corresponds to light incident on the third photosensor 221*c* of the pixel 220, and (b) to detect events based on non-CIS information (e.g., contrast change information) output from the pixel 520 that corresponds to light incident on the second photosensor 521*b* of the pixel 520.

Although the bonds 549*a* and 549*b* are shown in FIG. 5 as being coupled to different logarithmic amplifiers 550*a* and 550*b* of different EVS readout circuitry in FIG. 5, the bond 549*a* and the bond 549*b* can be coupled to a same EVS readout circuitry in other embodiments of the present technology. For example, the bond 549*a* and the bond 549*b* can be coupled to a same logarithmic amplifier. In these and other embodiments, a same EVS readout circuitry can be coupled to each of the EVS connections 229*a*-229*d* of the pixel 220 and/or to each of the EVS connections 529 of the pixel 520.

Additionally, or alternatively, although not shown in FIG. 5, the second logarithmic amplifier 550*b* of the second EVS readout circuitry can additionally be shared by a third pixel positioned above the pixel 220 and/or a fourth pixel positioned below the pixel 520. For example, a photosensor (e.g., a fourth photosensor) of a third pixel positioned above the pixel 220 in FIG. 5 can be selectively coupled to the second logarithmic amplifier 550*b* via a transfer transistor of the third pixel and via the bond 549*b*. Similarly, a photosensor (e.g., a first photosensor) of a fourth pixel positioned below the pixel 520 in FIG. 5 can be selectively coupled to the second logarithmic amplifier 550*b* via a transfer transistor of the fourth pixel and the bond 549*b*.

Figure 6A:
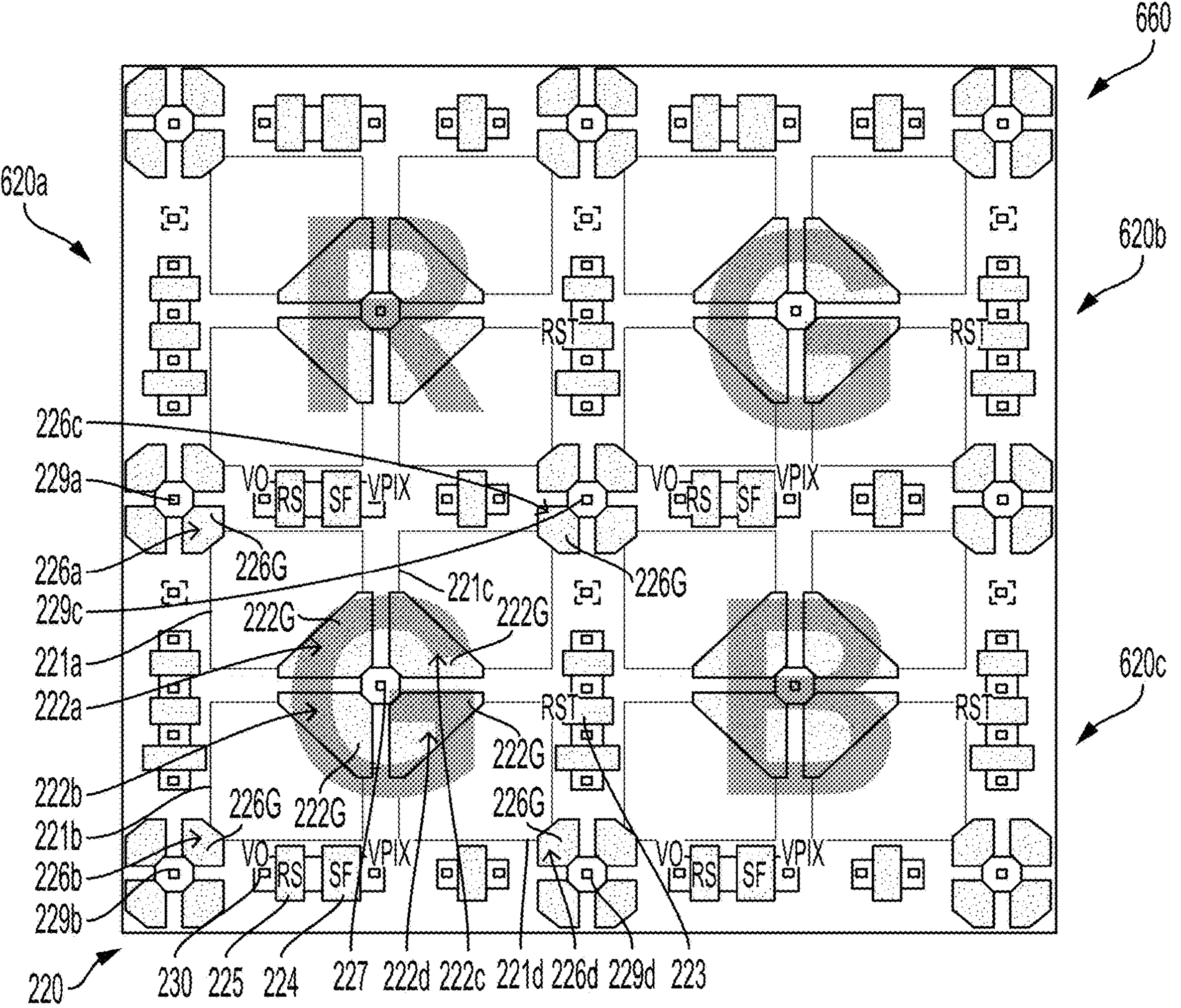
FIG. 6A is a partial schematic diagram illustrating a layout of a pixel arrangement configured in accordance with various embodiments of the present technology.

FIG. 6A is a partial schematic diagram illustrating an example layout of a pixel arrangement 660 configured in accordance with various embodiments of the present technology. As shown, the pixel arrangement 660 includes the pixel 220 of FIGS. 2A and 2B. The pixel arrangement 660 further includes a pixel 620*a*, a pixel 620*b*, and a pixel 620*c*. The pixels 620*a*-620*c* can each be an example of one of the pixels of the pixel array 108 of FIG. 1 or of other pixels configured in accordance with various embodiments of the present technology. As shown, the pixels 620*a*-620*c* are each generally similar to the pixel 220. Thus, a detailed description of each of the pixels 620*a*-620*c* is largely omitted here for the sake of brevity.

Referring first to the pixel 620*a*, the pixel 620*a* can share the EVS connection 229*a* and the EVS connection 229*c* with the pixel 220. More specifically, as discussed above, image charge photogenerated by the first photosensor 221*a* of the pixel 220 can be transferred to first EVS readout circuitry (not shown) via the EVS connection 229*a* at least when the transfer transistor 226*a* is activated, and image charge photogenerated by the third photosensor 221*c* of the pixel 220 can be transferred to second EVS readout circuitry (not shown) via the EVS connection 229*c* at least when the transfer transistor 226*c* is activated. Similarly, image charge generated by a second photosensor (e.g., the bottom-left photosensor) of the pixel 620*a* can be transferred to the first EVS readout circuitry via the EVS connection 229*a* at least when a corresponding transfer transistor of the pixel 620*a* is activated, and image charge photogenerated by a fourth photosensor (e.g., the bottom-right photosensor) of the pixel 620*a* can be transferred to the second EVS readout circuitry via the EVS connection 229*c* at least when a corresponding transfer transistor of the pixel 620*a* is activated.

The EVS connection 229*c* can be further shared by the pixel 620*b* and the pixel 620*c*. In particular, image charge photogenerated by a second photosensor (e.g., the bottom-left photosensor) of the pixel 620*b* can be transferred to the second EVS readout circuitry via the EVS connection 229*c* at least when a corresponding transfer transistor of the pixel 620*b* is activated. In addition, image charge photogenerated by a first photosensor (e.g., the top-left photosensor) of the pixel 620*c* can be transferred to the second EVS readout circuitry via the EVS connection 229*c* at least when a corresponding transfer transistor of the pixel 620*c* is activated.

The pixel 620*c* can further share the EVS connection 229*d* with the pixel 220. More specifically, as discussed above, image charge photogenerated by the fourth photosensor 221*d* can be transferred to third EVS circuitry (not shown) via the EVS connection 229*d* at least when the transfer transistor 226*d* is activated. Similarly, image charge photogenerated by a second photosensor (e.g., the bottom-left photosensor) of the pixel 620*c* can be transferred to the third EVS circuitry via the EVS connection 229*d* at least when a corresponding transfer transistor of the pixel 620*c* is activated.

In some embodiments, each of the pixels 220 and 620*a*-620*c* can include a microlens (not shown) and/or a color filter. For example, each of the pixels 220 and 620*a*-620*c* can include identical (or at least generally similar) color filters such that each of the pixels 220 and 620*a*-620*c* correspond to a same color (e.g., red, blue, or green). In other embodiments, two or more of the pixels 220 and 620*a*-620*c* can include different color filters from one another such that two or more of the pixels 220 and 620*a*-620*c* correspond to different colors from one another. In the illustrated embodiment, for example, the pixel 620*a* includes a first color filter such that the pixel 620*a* corresponds to the color red, the pixels 220 and 620*b* include second color filters such that the pixels 220 and 620*b* each correspond to the color green, and the pixel 620*c* includes a third color filter such that the pixel 620*c* corresponds to the color blue. As shown, the pixels 220 and 620*a*-620*c* are arranged in a Bayer pattern.

As discussed above, an EVS floating diffusion coupled to the EVS connection 229*c* can be shared by each of the pixels 220 and 620*a*-620*c*. In other words, image charge photogenerated by the third photosensor 221*c* of the pixel 220 can be transferred to the EVS connection 229*c* at least when the transfer transistor 226*c* is activated; image charge photogenerated by the bottom right photosensor of the pixel 620*a* can be transferred to the EVS connection 229*c* at least when a corresponding transfer transistor positioned between the bottom right photosensor and the EVS connection 229*c* is activated; image charge photogenerated by the bottom left photosensor of the pixel 620*b* can be transferred to the EVS connection 229*c* at least when a corresponding transfer transistor positioned between the bottom left photosensor and the EVS connection 229*c* is activated; and image charge photogenerated by the top left photosensor of the pixel 620*c* can be transferred to the EVS connection 229*c* at least when a corresponding transfer transistor positioned between the top left photosensor and the EVS connection 229*c* is activated. Thus, continuing with the above example in which the pixel 620*a* corresponds to a red color pixel, the pixels 220 and 620*b* correspond to green color pixels, and the pixel 620*c* corresponds to a blue color pixel, the EVS connection 229*c* can be configured and coupled to receive image charge corresponding to different colors, such as red (from pixel 620*a*), green (from pixel 220 and/or from pixel 620*b*), and/or blue (from pixel 620*c*). As a result, when one or more of the pixels 220 and 620*a*-620*c* are operated in an EVS-only mode or a hybrid CIS and EVS mode, the EVS connection 229*c* can be configured and coupled to receive image charge corresponding to one or more colors (red, green, and/or blue) for event detection. Additionally, or alternatively, when one or more of the pixels 220 and 620*a*-620*c* are operated in a CIS-only mode or a hybrid CIS and EVS mode, the EVS connection 229*c* can be configured and coupled to provide an anti-blooming path to drain excess image charge corresponding to one or more colors (red, green, and/or blue).

Figures 6B, 6C, 6D:
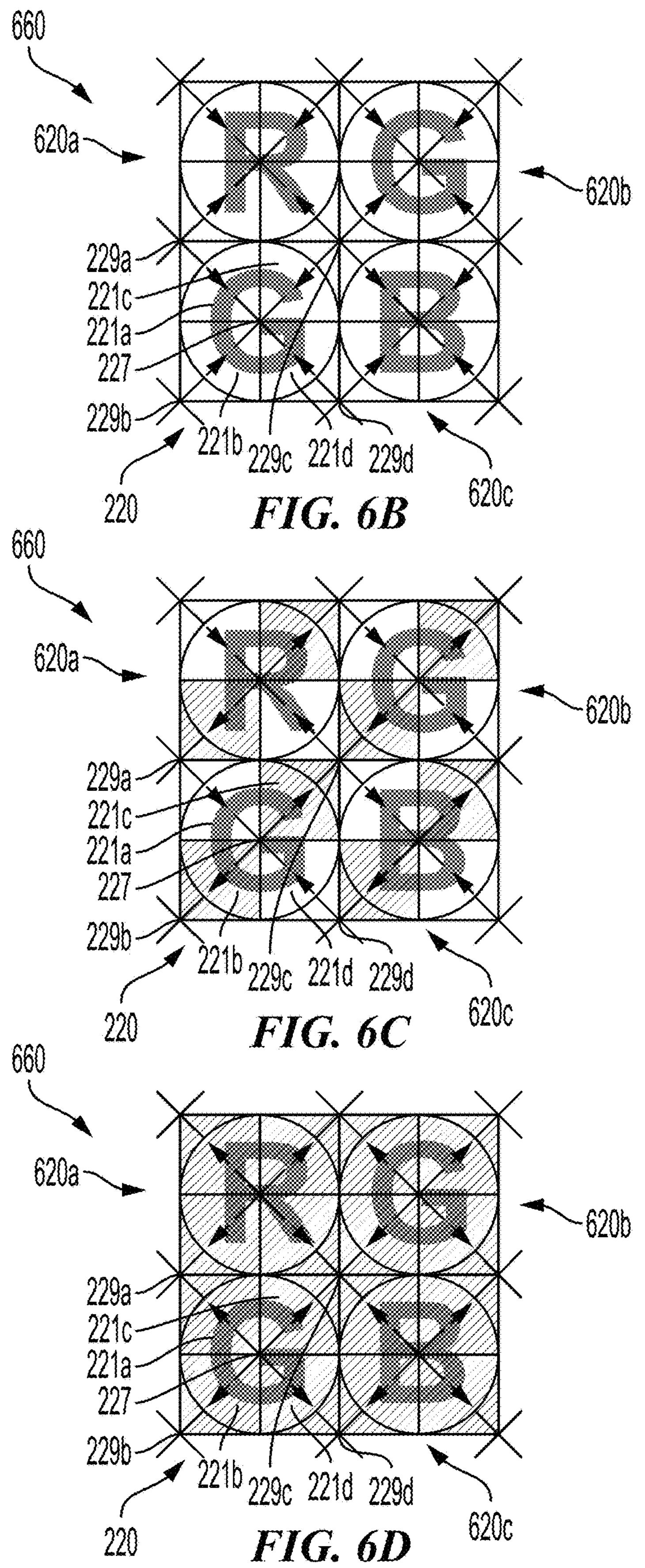
FIGS. 6B-6D are partial schematic diagrams of the pixel arrangement of FIG. 6A.

Each of the transfer gates (or transfer transistors) included in the pixels 220 and 620*a*-620*c* can be operated independently and/or in tandem with one another to achieve a desired ratio of CIS photosensors to EVS photosensors within the pixel arrangement 660. For example, FIGS. 6B-6D are partially schematic diagrams of the pixel arrangement 660 of FIG. 6A. More specifically, FIG. 6B illustrates the pixel arrangement 660 when the pixel arrangement 660 is operated in a CIS only mode in which all of the photosensors of the pixels 220 and 620*a*-620*c* are used to obtain CIS information. Operating the pixel arrangement 660 in the CIS only mode can be generally similar to operating the pixel 220 in the CIS only mode, as described above with reference to FIGS. 2C and 3A.

FIG. 6C illustrates the pixel arrangement 660 when the pixel arrangement 660 is operated in a hybrid CIS and EVS mode in which a first subset of the photosensors (e.g., the first and fourth photosensors) of the pixels 220 and 620*a*-620*c* are operated to obtain CIS information while a second subset of the photosensors (e.g., the second and third photosensors) of the pixels 220 and 620*a*-620*c* are operated to obtain non-CIS information. Operating the pixel arrangement 660 in the hybrid CIS and EVS mode can be generally similar to operating the pixel 220 in the hybrid CIS and EVS mode, as described above with reference to FIGS. 2E and 3B.

Although the pixel arrangement 660 is shown in FIG. 6C as using two photosensors of each of the pixels 220 and 620*a*-620*c* to obtain CIS information and another two photosensors of each of the pixels 220 and 620*a*-620*c* to obtain non-CIS information, the present technology is not so limited. In other embodiments, a different number of photosensors (e.g., one, two, three, or four photosensors) of each of one or more of the pixels 220 and 620*a*-620*c* can be used to obtain CIS information when the pixel arrangement 660 is operated in a hybrid CIS and EVS mode. Additionally, or alternatively, a different number of photosensors (e.g., zero, one, two, three, or four photosensors) of each of one or more of the pixels 220 and 620*a*-620*c* can be used to obtain non-CIS information when the pixel arrangement 660 is operated in a hybrid CIS and EVS mode. Indeed, the hybrid CIS and EVS mode of the pixel arrangement 660 can be programmable to provide any desired sensitivity between CIS and EVS. For example, when the pixel arrangement 660 is operated in the hybrid CIS and EVS mode, all or a subset of only the pixel 620*a* (e.g., corresponding to the color red), of only the pixel 620*c* (e.g., corresponding to the color blue), or of only the pixels 220 and 620*b* (e.g., corresponding to the color green) may be utilized to obtain non-CIS information for EVS functionality.

FIG. 6D illustrates the pixel arrangement 660 when the pixel arrangement 660 is operated in an EVS only mode in which all of the photosensors of each of the pixels 220 and 620*a*-620*c* are used to obtain non-CIS information. Operating the pixel arrangement 660 in the EVS only mode can be generally similar to operating the pixel 220 in the EVS only mode, as described above with reference to FIGS. 2D and 3C.

Figure 7A:
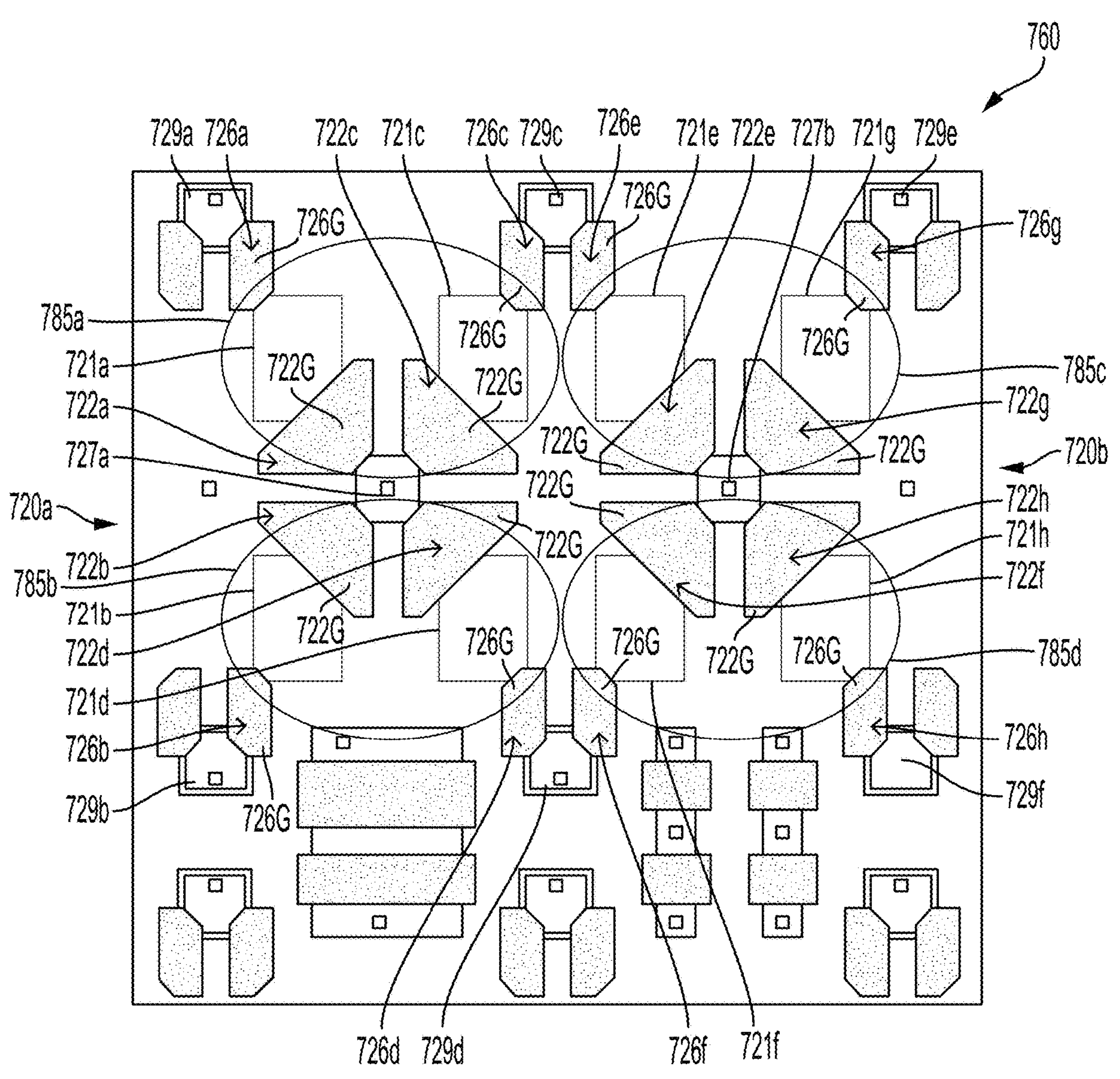
FIG. 7A is a partial schematic diagram illustrating an example layout of a pixel arrangement configured in accordance with various embodiments of the present technology.

The principals of the present technology may also be implemented in pixel arrangements that employ pixels having other pixel structures. For example, FIG. 7A is a partially schematic diagram illustrating an example layout of a pixel arrangement 760 configured in accordance with various embodiments of the present technology. As shown, the pixel arrangement 760 includes a first pixel 720*a* and a second pixel 720*b*. The first pixel 720*a* and/or second pixel 720*b* can each be an example of a pixel of the pixel array 108 of FIG. 1 or of other pixels configured in accordance with various embodiments of the present technology.

As shown, the first pixel 720*a* and the second pixel 720*b* are 2×2 shared dual photodiode (DPD) type pixels. Referring to the first pixel 720*a*, the first pixel 720*a* includes four photosensors 721 (identified individually in FIG. 7A as first through fourth photosensors 721*a*-721*d*), a floating diffusion 727*a*, and transfer transistors 722 (identified individually in FIG. 7A as first through fourth transfer transistors 722*a*-722*d*) that each selectively couples a corresponding one of the photosensors 721*a*-721*d* to the floating diffusion 727*a* based at least in part on first transfer control signals (not shown). The first pixel 720*a* further includes (a) four EVS connections 729*a*-729*d* and (b) transfer transistors 726 (identified individually in FIG. 7A as first through fourth transfer transistors 726*a*-726*d*) that each selectively couples a corresponding one of the photosensors 721*a*-721*d* to a corresponding one of the EVS connections 729*a*-729*d* based at least in part on second transfer control signals (not shown). In some embodiments, the first pixel 720*a* further includes a first microlens 785*a* positioned over the first photosensor 721*a* and the third photosensor 721*c*, and a second microlens 785*b* positioned over the second photosensor 721*b* and the fourth photosensor 721*d*.

Referring now to the second pixel 720*b*, the second pixel 720*b* similarly includes four photosensors 721 (identified individually in FIG. 7A as first through fourth photosensors 721*e*-721*h*), a floating diffusion 727*b*, and transfer transistors 722 (identified individually in FIG. 7A as first through fourth transfer transistors 722*e*-722*h*) that each selectively couples a corresponding one of the photosensors 721*e*-721*h* to the floating diffusion 727*b* based at least in part on third transfer control signals (not shown). The second pixel 720*b* further includes (a) four EVS connections 729*c*-729*f* and (b) transfer transistors 726 (identified individually in FIG. 7A as first through fourth transfer transistors 726*e*-726*h*) that each selectively couples a corresponding one of the photosensors 721*e*-721*h* to a corresponding one of the EVS connections 729*c*-729*f* based at least in part on fourth transfer control signals (not shown). Thus, the second pixel 720*b* shares the EVS connection 729*c* and the EVS connection 729*d* with the first pixel 720*a*. In some embodiments, the second pixel 720*b* further includes a third microlens 785*c* positioned over the first photosensor 721*e* and the third photosensor 721*g*, and a fourth microlens 785*d* positioned over the second photosensor 721*f* and the fourth photosensor 721*h*.

The transfer transistors 722*a*-722*d* and 726*a*-726*d* (and/or their corresponding transfer gates 722G and 726G, respectively) of the first pixel 720*a* can be operated (i) independently and/or in tandem with one another and/or (ii) independently and/or in tandem with the transfer transistors 722*e*-722*h* and 726*e*-726*h* (and/or their corresponding transfer gates 722G and 726G, respectively) of the second pixel 720*b*, to achieve a desired ratio of CIS photosensors to EVS photosensors within the pixel arrangement 760. For example, FIGS. 7B-7D are partially schematic diagrams of the pixel arrangement 760 of FIG. 7A. More specifically, FIG. 7B illustrates the pixel arrangement 760 when the pixel arrangement 760 is operated in a CIS only mode in which all of the photosensors 721*a*-721*d* of the first pixel 720*a* and all of the photosensors 721*e*-721*h* of the second pixel 720*b* are used to obtain CIS information. Operating the pixel arrangement 760 in the CIS only mode can be generally similar to operating the pixel 220 of FIGS. 2A and 2B in the CIS only mode, as described above with reference to FIGS. 2C and 3A.

FIG. 7C illustrates the pixel arrangement 760 when the pixel arrangement 760 is operated in a hybrid CIS and EVS mode in which all of the photosensors 721*a*-721*d* of the first pixel 720*a* are operated to obtain non-CIS information while all of the photosensors 721*e*-721*h* of the second pixel 720*b* are operated to obtain CIS information. Operating the pixel arrangement 760 in the hybrid CIS and EVS mode can be generally similar to operating the pixel 220 of FIGS. 2A and 2B in the hybrid CIS and EVS mode, as described above with reference to FIGS. 2E and 3B.

Although the pixel arrangement 760 is shown in FIG. 7C as using all of the photosensors 721*e*-721*h* of the second pixel 720*b* to obtain CIS information and all of the photosensors 721*a*-721*d* of the first pixel 720*a* to obtain non-CIS information, the present technology is not so limited. In other embodiments, a first number of photosensors (e.g., one, two, three, or four photosensors) of the first pixel 720*a* and a second number of photosensors (e.g., one, two, three, or four photosensors) of the second pixel 720*b* can be used to obtain CIS information when the pixel arrangement 760 is operated in a hybrid CIS and EVS mode. Additionally, or alternatively, a third different number of photosensors (e.g., one, two, three, or four photosensors) of the first pixel 720*a* and a fourth number of photosensors (e.g., one, two, three, or four photosensors) of the second pixel 720*b* can be used to obtain non-CIS information when the pixel arrangement 760 is operated in a hybrid CIS and EVS mode. Indeed, the hybrid CIS and EVS mode of the pixel arrangement 760 can be programmable to provide any desired sensitivity between CIS and EVS.

FIG. 7D illustrates the pixel arrangement 760 when the pixel arrangement 760 is operated in an EVS only mode in which all of the photosensors 721*a*-721*d* of the first pixel 720*a* and all of the photosensors 721*e*-721*h* of the second pixel 720*b* are used to obtain non-CIS information. Operating the pixel arrangement 760 in the EVS only mode can be generally similar to operating the pixel 220 of FIGS. 2A and 2B in the EVS only mode, as described above with reference to FIGS. 2D and 3C.

Figure 8:
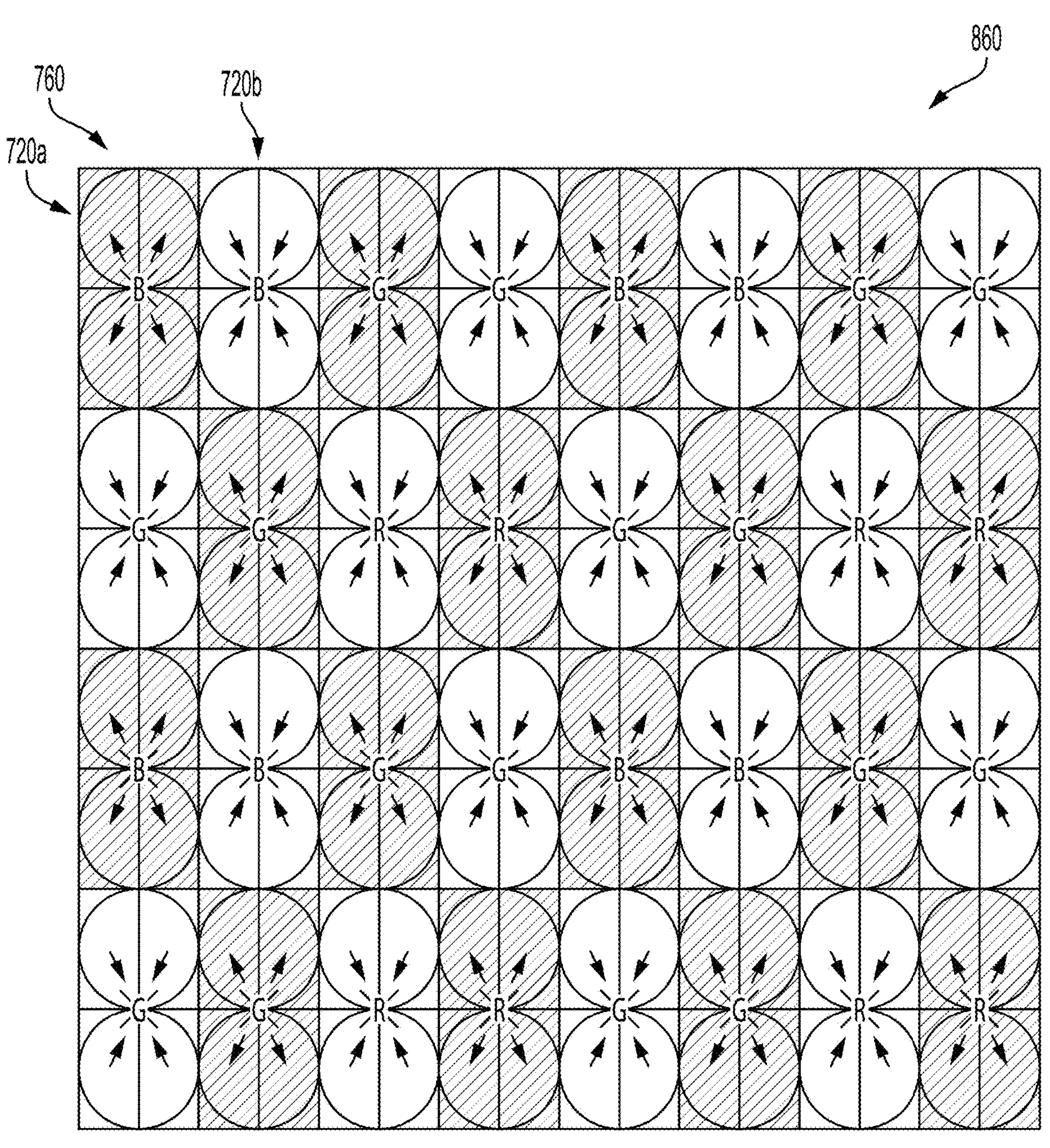
FIG. 8 is a partial schematic diagram of a pixel arrangement configured in accordance with various embodiments of the present technology.

The pixel arrangement 760 of FIGS. 7A-7D can be incorporated into larger pixel arrangements. For example, FIG. 8 is a partially schematic diagram of a pixel arrangement 860 configured in accordance with various embodiments of the present technology. As shown, the pixel arrangement 860 includes the first pixel 720*a* and the second pixel 720*b* of the pixel arrangement 760, as well as a plurality of pixels that are generally similar to the first pixel 720*a* and the second pixel 720*b*. Thus, a detailed description of the other pixels of the pixel arrangement 860 is omitted here for the sake of brevity.

As shown, the first pixel 720*a* and the second pixel 720*b* can correspond to a blue channel of the pixel arrangement 860. More specifically, the pixel arrangement 760 is positioned in a Bayer pattern in the pixel arrangement 860 with other similar pixel arrangements that correspond to a same color channel (e.g., blue) as the pixel arrangement 760 or to a different color channel (e.g., green or red) than the pixel arrangement 760.

A hybrid CIS and EVS mode of the pixel arrangement 860 is shown in FIG. 8. More specifically, one pixel of every pair of pixels in the pixel arrangement 860 is used to obtain CIS information while the other pixel of every pair of pixels is used to obtain non-CIS information. The result is that every other pixel in the pixel arrangement 860 is used to obtain CIS information such that pixels used to obtain CIS information are interleaved with pixels used to obtain non-CIS information. As discussed above, the present technology is not so limited, and the hybrid CIS and EVS mode of the pixel arrangement 860 can be programmable to provide any desired sensitivity between CIS and EVS.

C. CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order above, alternative embodiments may perform steps in a different order. Furthermore, the various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where context permits, singular or plural terms may also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Moreover, as used herein, the phrases "based on," "depends on," "as a result of," and "in response to" shall not be construed as a reference to a closed set of conditions. For example, an exemplary step that is described as "based on condition A" may be based on both condition A and condition B without departing from the scope of the present disclosure. In other words, as used herein, the phrase "based on" shall be construed in the same manner as the phrase "based at least in part on" or the phrase "based at least partially on." Also, the terms "connect" and "couple" are used interchangeably herein and refer to both direct and indirect connections or couplings. For example, where the context permits, element A "connected" or "coupled" to element B can refer (i) to A directly "connected" or directly "coupled" to B and/or (ii) to A indirectly "connected" or indirectly "coupled" to B.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A pixel arrangement, comprising:

a pixel including— a first photosensor configured to photogenerate first charge based at least in part on first light incident on the first photosensor;

a second photosensor different from the first photosensor and configured to photogenerate second charge based at least in part on second light incident on the second photosensor;

a floating diffusion;

a first event vision sensor (EVS) connection coupling the pixel to first EVS readout circuitry and configured to receive the first charge from the first photosensor;

a second EVS connection coupling the pixel to second EVS readout circuitry and configured to receive the second charge from the second photosensor;

a first transfer transistor selectively coupling the first photosensor to the floating diffusion based at least in part on a first transfer control signal;

a second transfer transistor configured, based at least in part on a second transfer control signal, to selectively couple the first photosensor to the first EVS connection such that the first photosensor is selectively couplable to the first EVS readout circuitry independently from the second EVS connection;

a third transfer transistor selectively coupling the second photosensor to the floating diffusion based at least in part on a third transfer control signal different from the first and second transfer control signals; and a fourth transfer transistor configured, based at least in part on a fourth transfer control signal, to selectively couple the second photosensor to the second EVS connection such that the second photosensor is selectively couplable to the second EVS readout circuitry independently form the first EVS connection.

2. The pixel arrangement of claim 1, wherein the fourth transfer control signal is different from the first, second, and third transfer control signals.

3. The pixel arrangement of claim 1, wherein:

the pixel is a first pixel and the floating diffusion is a first floating diffusion; and the pixel arrangement further includes a second pixel different from the first pixel, the second pixel including— a third photosensor configured to photogenerate third charge based at least in part on third light incident on the third photosensor;

a second floating diffusion;

a third EVS connection coupling the pixel to third EVS readout circuitry and configured to receive the third charge from the third photosensor;

a fifth transfer transistor selectively coupling the third photosensor to the second floating diffusion based at least in part on a fifth transfer control signal; and a sixth transfer transistor selectively coupling the third photosensor to the third EVS connection based at least in part on a sixth transfer control signal.

4. The pixel arrangement of claim 3, wherein the third EVS readout circuitry is the second EVS readout circuitry, and wherein the third EVS connection is the second EVS connection.

5. The pixel arrangement of claim 4, wherein:

the first pixel is disposed under a first color filter such that the first pixel corresponds to a first color;

the second pixel is disposed under a second color filter such that the second pixel corresponds to a second color different from the first color; and the third EVS readout circuitry is configurable to receive image charge photogenerated by the second photosensor, the third photosensor, and both the second and third photosensors via the third EVS connection.

6. The pixel arrangement of claim 4, wherein the third EVS connection is positioned between the second photosensor and the third photosensor.

7. The pixel arrangement of claim 1, wherein the pixel further includes:

a third photosensor configured to photogenerate third charge based at least in part on third light incident on the third photosensor;

a fourth photosensor configured to photogenerate fourth charge based at least in part on fourth light incident on the fourth photosensor;

a third EVS connection coupling the pixel to third EVS readout circuitry and configured to receive the third charge from the third photosensor;

a fourth EVS connection coupling the pixel to fourth EVS readout circuitry and configured to receive the fourth charge from the fourth photosensor;

a fifth transfer transistor selectively coupling the third photosensor to the floating diffusion based at least in part on a fifth transfer control signal;

a sixth transfer transistor selectively coupling the third photosensor to the third EVS connection based at least in part on a sixth transfer control signal; and a seventh transfer transistor selectively coupling the fourth photosensor to the floating diffusion based at least in part on a seventh transfer control signal.

8. The pixel arrangement of claim 7, wherein the pixel further includes an eighth transfer transistor selectively coupling the fourth photosensor to the fourth EVS connection based at least in part on an eighth transfer control signal.

9. The pixel arrangement of claim 7, wherein the first photosensor, the second photosensor, the third photosensor, and the fourth photosensor are positioned relative to the floating diffusion such that they surround the floating diffusion.

10. The pixel arrangement of claim 7, wherein (a) the first photosensor and the fourth photosensor are positioned on opposite sides of the floating diffusion and are diagonally offset from one another, and (b) the second photosensor and the third photosensor are positioned on opposite sides of the floating diffusion and are diagonally offset from one another.

11. The pixel arrangement of claim 1, wherein the second EVS readout circuitry is the first EVS readout circuitry.

12. The pixel arrangement of claim 1, wherein the floating diffusion and the first EVS connection are diagonally offset from one another, and wherein the first photosensor is positioned between the floating diffusion and the first EVS connection.

13. The pixel arrangement of claim 12, wherein the floating diffusion and the second EVS connection are diagonally offset from one another, and wherein the first EVS connection and the second EVS connection are diagonally offset from one another.

14. The pixel arrangement of claim 12, wherein (a) the first photosensor is positioned between the floating diffusion and the first EVS connection, and (b) the second photosensor is positioned between the floating diffusion and the second EVS connection.

15. The pixel arrangement of claim 12, wherein, while integrating the first charge, the second transfer transistor is activatable to provide an anti-blooming path to the first EVS readout circuitry via the first EVS connection.

16. A pixel arrangement disposed in a semiconductor material, the pixel arrangement comprising:

a pixel including— a floating diffusion disposed in the semiconductor material at a central region of the semiconductor material;

a plurality of photosensors disposed in the semiconductor material at locations distributed about the floating diffusion;

a plurality of first transfer transistors, wherein each first transfer transistor of the plurality of first transfer transistors (a) is disposed in the semiconductor material at a location between the floating diffusion and a respective photosensor of the plurality of photosensors, and (b) is configured to selectively couple the respective photosensor to the floating diffusion;

a plurality of event vision sensor (EVS) connections disposed at least partially in the semiconductor material and usable to couple a respective one of the plurality of photosensors to EVS readout circuitry, wherein the plurality of EVS connections include a first EVS connection and a second EVS connection are diagonally offset from one another; and a plurality of second transfer transistors, wherein each second transfer transistor of the plurality of second transfer transistors (a) is disposed in the semiconductor material at a location between a corresponding one of the plurality of photosensors and a corresponding one of the plurality of EVS connections, and (b) is configured to selectively couple the corresponding one of the plurality of photosensors to the corresponding one of the plurality of EVS connections.

17. The pixel arrangement of claim 16, wherein:

the pixel is a first pixel, the floating diffusion is a first floating diffusion, the central region is a first central region, the plurality of photosensors is a first plurality of photosensors, the plurality of first transfer transistors is a first plurality of first transfer transistors, the plurality of EVS connections is a first plurality of EVS connections, and the plurality of second transfer transistors is a first plurality of second transfer transistors; and the pixel arrangement further comprises a second pixel neighboring the first pixel, the second pixel including— a second floating diffusion disposed in the semiconductor material at a second central region of the semiconductor material;

a second plurality of photosensors disposed in the semiconductor material at locations distributed about the second floating diffusion;

a second plurality of first transfer transistors, wherein each first transfer transistor of the second plurality of first transfer transistors (a) is disposed in the semiconductor material at a location between the second floating diffusion and a respective photosensor of the second plurality of photosensors, and (b) is configured to selectively couple the respective photosensor to the second floating diffusion;

a second plurality of EVS connections disposed at least partially in the semiconductor material and usable to couple a respective one of the second plurality of photosensors to the EVS readout circuitry; and a second plurality of second transfer transistors, wherein each second transfer transistor of the second plurality of second transfer transistors (a) is disposed in the semiconductor material at a location between a corresponding one of the second plurality of photosensors and a corresponding one of the second plurality of EVS connections, and (b) is configured to selectively couple the corresponding one of the second plurality of photosensors to the corresponding one of the second plurality of EVS connections.

18. The pixel arrangement of claim 17, wherein the first plurality of EVS connections and the second plurality of EVS connections include at least one EVS connection in common such that the at least one EVS connection is shared between the first pixel and the second pixel.

19. The pixel arrangement of claim 16, further comprising a microlens disposed over the plurality of photosensors.

20. The pixel arrangement of claim 16, further comprising:

a first microlens disposed over a first subset of the plurality of photosensors; and a second microlens different from the first microlens and disposed over a second subset of the plurality of photosensors.

21. A pixel, comprising:

a first photosensor configured to photogenerate first charge based at least in part on first light incident on the first photosensor;

a second photosensor different from the first photosensor and configured to photogenerate second charge based at least in part on second light incident on the second photosensor;

a floating diffusion configured to receive the first charge from the first photosensor and the second charge from the second photosensor;

a first event vision sensor (EVS) connection usable to couple the pixel to first EVS readout circuitry and configured to receive the first charge from the first photosensor;

a second EVS connection usable to couple the pixel to second EVS readout circuitry and configured to receive the second charge from the second photosensor; and a mode switch including— a first switch selectively coupling the first photosensor to the floating diffusion, a second switch selectively coupling the first photosensor to the first EVS connection independently from the second EVS connection, a third switch selectively coupling the second photosensor to the floating diffusion, and a fourth switch selectively coupling the second photosensor to the second EVS connection independently from the first EVS connection, wherein the mode switch is controllable to transition the pixel between (i) a first mode in which the pixel is usable to generate a first output corresponding to intensity information of the first light, the second light, or both the first light and the second light; and (ii) a second mode in which the pixel is usable to generate a second output corresponding to contrast information of the first light, the second light, or both the first light and the second light.

22. The pixel of claim 21, wherein:

the first output corresponds to intensity information of both the first light and the second light; and to transition the pixel to the first mode in which the pixel is usable to generate the first output, the mode switch is controllable to activate the first switch and the third switch such that the first photosensor and the second photosensor are coupled to the floating diffusion.

23. The pixel of claim 22, wherein, to transition the pixel to the first mode in which the pixel is usable to generate the first output, the mode switch is controllable to activate the first switch and the third switch such that the first photosensor and the second photosensor are simultaneously coupled to the floating diffusion.

24. The pixel of claim 22, wherein, to transition the pixel to the first mode in which the pixel is usable to generate the first output, the mode switch is controllable to activate the first switch and the third switch such that the first photosensor and the second photosensor are coupled to the floating diffusion at different times.

25. The pixel of claim 21, wherein:

the second output corresponds to contrast information of both the first light and the second light; and to transition the pixel to the second mode in which the pixel is usable to generate the second output, the mode switch is controllable to activate the second switch and the fourth switch such that the first photosensor and the second photosensor are coupled to the first EVS connection and the second EVS connection, respectively.

26. The pixel of claim 21, wherein:

the first output corresponds to intensity information of the first light;

the second output corresponds to contrast information of the second light;

the pixel is usable to simultaneously generate the first output and the second output while the pixel is in the second mode; and to transition the pixel to the second mode in which the pixel is usable to simultaneously generate the first output and the second output, the mode switch is controllable to (i) activate the first switch such that the first photosensor is coupled to the floating diffusion, and (ii) activate the fourth switch such that the second photosensor is coupled to the second EVS connection.

27. The pixel of claim 21, wherein:

the first switch includes a first transfer transistor configured to selectively couple the first photosensor to the floating diffusion based at least in part on a first transfer control signal; and the third switch includes a second transfer transistor configured to selectively couple the second photosensor to the floating diffusion based at least in part on a second transfer control signal different from the first transfer control signal.

28. The pixel of claim 27, wherein:

the second switch includes a third transfer transistor configured to selectively couple the first photosensor to the first EVS connection based at least in part on a third transfer control signal different from the first and second transfer control signals; and the fourth switch includes a fourth transfer transistor configured to selectively couple the second photosensor to the second EVS connection based at least in part on a fourth transfer control signal different from the first, second, and third transfer control signals.

29. The pixel of claim 21, wherein:

the first switch includes a first transfer transistor configured to selectively couple the first photosensor to the floating diffusion based at least in part on a first transfer control signal; and the second switch includes a second transfer transistor configured to selectively couple the first photosensor to the first EVS connection based at least in part on a second transfer control signal different from the first transfer control signal.

30. The pixel of claim 21, further comprising:

a third photosensor configured to photogenerate third charge based at least in part on third light incident on the third photosensor; and a fifth switch selectively coupling the third photosensor to the floating diffusion.

31. The pixel of claim 30, further comprising a third EVS connection usable to couple the pixel to third EVS readout circuitry and configured to receive the third charge from the third photosensor.

32. The pixel of claim 31, further comprising a sixth switch selectively coupling the third photosensor to the third EVS connection.

33. The pixel of claim 21, further comprising:

a fourth photosensor configured to photogenerate fourth charge based at least in part on fourth light incident on the fourth photosensor; and a sixth switch selectively coupling the fourth photosensor to the floating diffusion.

34. The pixel of claim 33, further comprising:

a third EVS connection usable to couple the pixel to third EVS readout circuitry and configured to receive the third charge from the third photosensor;

a fourth EVS connection usable to couple the pixel to fourth EVS readout circuitry and configured to receive the fourth charge from the fourth photosensor;

a seventh switch selectively coupling the third photosensor to the third EVS connection; and an eighth switch selectively coupling the fourth photosensor to the fourth EVS connection.

* * * * *